(12) United States Patent
You

(10) Patent No.: US 11,569,320 B2
(45) Date of Patent: Jan. 31, 2023

(54) DISPLAY PANEL INCLUDING DAM AND RECESS, AND DISPLAY APPARATUS INCLUDING THE SAME

(71) Applicant: Samsung Display Co., Ltd., Yongin-si (KR)

(72) Inventor: Chungi You, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 155 days.

(21) Appl. No.: 17/079,318

(22) Filed: Oct. 23, 2020

(65) Prior Publication Data

US 2021/0343810 A1 Nov. 4, 2021

(30) Foreign Application Priority Data

Apr. 29, 2020 (KR) ........................ 10-2020-0052889

(51) Int. Cl.
*H01L 29/10* (2006.01)
*H01L 27/32* (2006.01)
(Continued)

(52) U.S. Cl.
CPC ...... *H01L 27/3258* (2013.01); *H01L 27/3262* (2013.01); *H01L 51/0016* (2013.01);
(Continued)

(58) Field of Classification Search
CPC ............. H01L 27/3258; H01L 27/3262; H01L 27/1225; H01L 51/5072; H01L 51/5221; H01L 51/5253
(Continued)

(56) References Cited

U.S. PATENT DOCUMENTS 10,205,122 B2  2/2019 Choi et al.
10,644,087 B2  5/2020 Lee et al.
(Continued)

FOREIGN PATENT DOCUMENTS

CN  109065743 A  * 12/2018  ......... H01L 51/5237
CN  110032014 A  *  7/2019
(Continued)

OTHER PUBLICATIONS

EPO Extended European Search Report dated Sep. 24, 2021, issued in corresponding European Patent Application No. 21167744.8 (8 pages).

*Primary Examiner* — Phuc T Dang
(74) *Attorney, Agent, or Firm* — Lewis Roca Rothgerber Christie LLP

(57) ABSTRACT

A display panel includes: a substrate including an opening area, a display area, and a non-display area, the display area surrounding the opening area, and the non-display area being between the opening area and the display area; a plurality of display elements at the display area of the substrate, each of the display elements including a pixel electrode, an emission layer on the pixel electrode, and an opposite electrode on the emission layer; a thin-film encapsulation layer covering the plurality of display elements; a dam at the non-display area, and protruding from a top surface of a first insulating layer; and a recess between the opening area and the dam, and recessed in a depth direction of the first insulating layer. A lateral wall of the dam meets a first lateral wall from among lateral walls of the recess, the first lateral wall being adjacent to the display area.

20 Claims, 16 Drawing Sheets

(51) Int. Cl.
*H01L 51/00* (2006.01)
*H01L 51/52* (2006.01)
*H01L 27/12* (2006.01)
*H01L 51/50* (2006.01)

(52) U.S. Cl.
CPC ...... *H01L 51/0023* (2013.01); *H01L 51/5221* (2013.01); *H01L 51/5253* (2013.01); *H01L 27/124* (2013.01); *H01L 27/1225* (2013.01); *H01L 51/5056* (2013.01); *H01L 51/5072* (2013.01); *H01L 51/5088* (2013.01); *H01L 51/5092* (2013.01); *H01L 2227/323* (2013.01)

(58) Field of Classification Search
USPC .......................................................... 257/43
See application file for complete search history.

(56) References Cited

U.S. PATENT DOCUMENTS

| | | | |
|---|---|---|---|
| 2014/0346452 A1* | 11/2014 | You | H01L 27/3258 257/40 |
| 2017/0288004 A1* | 10/2017 | Kim | H01L 51/5246 |
| 2019/0081089 A1 | 3/2019 | Cho et al. | |
| 2020/0106045 A1* | 4/2020 | Han | H01L 27/3234 |
| 2020/0119304 A1 | 4/2020 | Choi et al. | |
| 2020/0135089 A1* | 4/2020 | Ji | H01L 33/62 |

FOREIGN PATENT DOCUMENTS

| | | |
|---|---|---|
| CN | 110120464 A | 8/2019 |
| CN | 110429118 A | 11/2019 |
| JP | 2019-66517 A | 4/2019 |
| KR | 10-2017-0059864 A | 5/2017 |
| KR | 10-2018-0042884 A | 4/2018 |
| KR | 10-2019-0096467 A | 8/2019 |

* cited by examiner

DISPLAY PANEL INCLUDING DAM AND RECESS, AND DISPLAY APPARATUS INCLUDING THE SAME

CROSS-REFERENCE TO RELATED APPLICATION

This application claims priority to and the benefit of Korean Patent Application No. 10-2020-0052889, filed on Apr. 29, 2020, in the Korean Intellectual Property Office, the entire disclosure of which is incorporated by reference herein.

BACKGROUND

1. Field

Aspects of one or more embodiments relate to a display panel in which an organic material is removed by using a laser lift-off process, and a display apparatus including the display panel.

2. Description of Related Art

Recently, usage of display apparatuses has diversified. In addition, as display apparatuses have become thinner and lighter, their range of use has gradually been extended.

As an area occupied by a display area in display apparatuses expands, various functions that are combined or associated with the display apparatuses have been added. In order to add various functions while expanding the display area, research has been carried out on display apparatuses including an opening in a display area.

The above information disclosed in this Background section is for enhancement of understanding of the background of the present disclosure, and therefore, it may contain information that does not constitute prior art.

SUMMARY

In the case of display apparatuses including an opening, foreign substances such as moisture may penetrate through a lateral surface of the opening. In this case, display elements surrounding the opening may be damaged. One or more example embodiments of the present disclosure are directed to a display panel having a structure that may prevent or substantially prevent moisture transmission through an opening, and a display apparatus including the display panel. However, it should be understood that embodiments described herein should be considered in a descriptive sense only and not for limitation of the present disclosure.

Additional aspects will be set forth in part in the description which follows and, in part, will be apparent from the description, or may be learned by practice of one or more of the presented embodiments of the present disclosure.

According to one or more example embodiments of the present disclosure, a display panel includes: a substrate including an opening area, a display area, and a non-display area, the display area surrounding the opening area, and the non-display area being between the opening area and the display area; a plurality of display elements at the display area of the substrate, each of the plurality of display elements including a pixel electrode, an emission layer on the pixel electrode, and an opposite electrode on the emission layer; a thin-film encapsulation layer covering the plurality of display elements, and including a first inorganic encapsulation layer, an organic encapsulation layer, and a second inorganic encapsulation layer; a dam at the non-display area, and protruding from a top surface of a first insulating layer; and a recess between the opening area and the dam, and recessed in a depth direction of the first insulating layer. A lateral wall of the dam meets a first lateral wall from among lateral walls of the recess, the first lateral wall being adjacent to the display area.

In an example embodiment, the display panel may further include: at least one of a first functional layer between the pixel electrode and the emission layer, or a second functional layer between the emission layer and the opposite electrode. The opposite electrode and the at least one of the first functional layer or the second functional layer may extend from the display area to the non-display area to be located inside the recess, and may include a transmission hole exposing a portion of the non-display area.

In an example embodiment, a lateral wall of the transmission hole may meet a second lateral wall from among the lateral walls of the recess, the second lateral wall being adjacent to the opening area.

In an example embodiment, the display panel may further include a capping layer on the opposite electrode, and the capping layer may be on a top portion of the dam, and may be inside the recess.

In an example embodiment, the display panel may further include a pixel circuit including at least one thin film transistor at the display area of the substrate, and electrically connected to the pixel electrode.

In an example embodiment, the at least one thin film transistor may include a first thin film transistor including polycrystalline silicon, and a second thin film transistor including an oxide semiconductor.

In an example embodiment, a second gate electrode of the second thin film transistor may include a first layer and a second layer that are stacked on one another, the first layer including titanium (Ti), and the second layer including molybdenum (Mo).

In an example embodiment, a gate electrode of the at least one thin film transistor may include a first layer, and a second layer stacked on the first layer.

In an example embodiment, the first layer may include titanium (Ti), and the second layer may include molybdenum (Mo).

In an example embodiment, a thickness of the first layer may be in a range from about 70 Å to about 300 Å.

According to one or more example embodiments of the present disclosure, a display apparatus includes: a display panel including: a substrate including an opening area, a display area, and a non-display area, the opening area corresponding to a first opening of the display panel, the display area surrounding the opening area, and the non-display area being between the opening area and the display area; a plurality of display elements at the display area of the substrate, each of the plurality of display elements including a pixel electrode, an emission layer on the pixel electrode, and an opposite electrode on the emission layer; a thin-film encapsulation layer covering the plurality of display elements, and including a first inorganic encapsulation layer, an organic encapsulation layer, and a second inorganic encapsulation layer; a dam at the non-display area, and protruding from a top surface of a first insulating layer; and a recess between the opening area and the dam, and recessed in a depth direction of the first insulating layer; and a component located to correspond to the first opening. A lateral wall of the dam meets a first lateral wall from among lateral walls of the recess, the first lateral wall being adjacent to the display area.

In an example embodiment, the display apparatus may further include: an input sensing member over the display panel; and an optical functional member on the input sensing member, and at least one of the input sensing member or the optical functional member may include an opening corresponding to the first opening.

In an example embodiment, the component may be located inside the first opening.

In an example embodiment, the component may include a camera.

In an example embodiment, the display apparatus may further include: at least one of a first functional layer between the pixel electrode and the emission layer, or a second functional layer between the emission layer and the opposite electrode. The opposite electrode and the at least one of the first functional layer or the second functional layer may extend from the display area to the non-display area to be located inside the recess, and may include a transmission hole exposing a portion of the non-display area.

In an example embodiment, the display apparatus may further include a capping layer on the opposite electrode, and the capping layer may be continuously located over the dam and the recess.

In an example embodiment, the display apparatus may further include a pixel circuit including at least one thin film transistor at the display area of the substrate, and electrically connected to the pixel electrode.

In an example embodiment, a gate electrode of the at least one thin film transistor may include a first layer and a second layer, the first layer including titanium (Ti), and the second layer including molybdenum (Mo).

In an example embodiment, a thickness of the first layer may be in a range from about 70 Å to about 300 Å.

In an example embodiment, the at least one thin film transistor may include a first thin film transistor including polycrystalline silicon, and a second thin film transistor comprising an oxide semiconductor.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
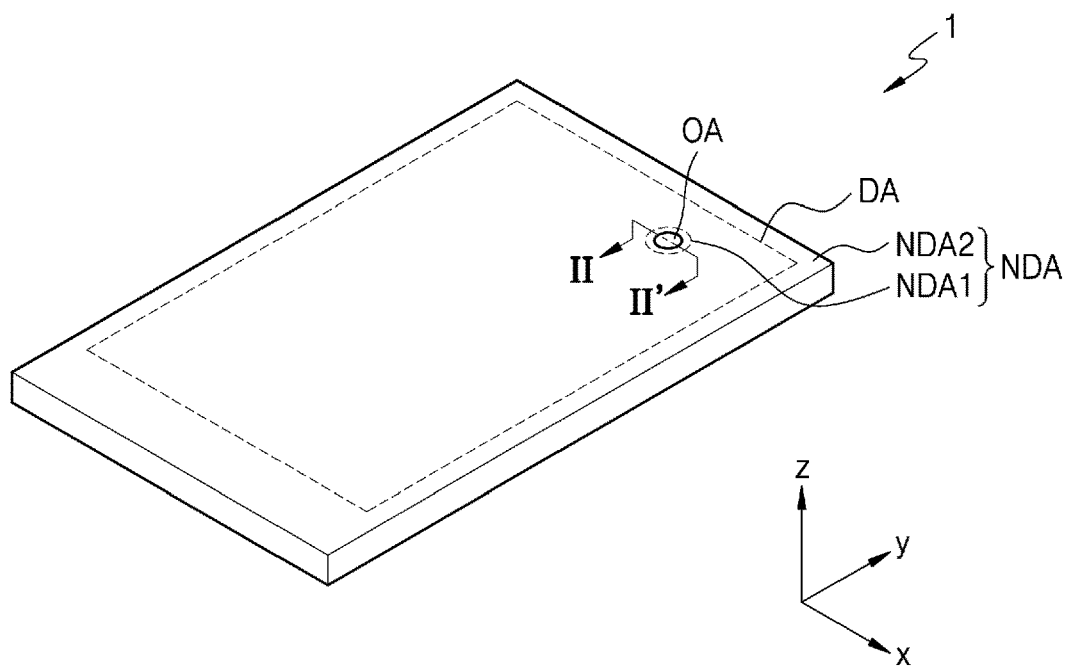
FIG. 1 is a perspective view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Further, when a certain embodiment may be implemented differently, a specific process order may be performed differently from the described order. For example, two consecutively described processes may be performed substantially at the same time or performed in an order opposite to the described order. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. In other words, because sizes and thicknesses of components in the drawings may be arbitrarily illustrated for convenience of explanation, the example embodiments of the present disclosure are not limited thereto. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, it will be understood that when a layer, region, or component is referred to as being "electrically connected" to another layer, region, or component, it may be "directly electrically connected" to the other layer, region, or component and/or may be "indirectly electrically connected" to other layer, region, or component with one or more intervening layers, regions, or components interposed therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment.

Referring to FIG. 1, the display apparatus 1 includes a display area DA and a non-display area NDA. Light may be emitted from the display area DA, and light may not be emitted from the non-display area NDA. The non-display area NDA may be adjacent to (e.g., may neighbor) the display area DA. The display apparatus 1 displays an image by using light emitted from a plurality of pixels arranged at (e.g., in or on) the display area DA.

The display apparatus 1 includes an opening area OA that is at least partially surrounded (e.g., around a periphery thereof) by the display area DA. In an embodiment, as shown in FIG. 1, the opening area OA may be entirely surrounded (e.g., around a periphery thereof) by the display area DA. The non-display area NDA may include a first non-display area NDA1 and a second non-display area NDA2. The first non-display area NDA1 may surround (e.g., around a periphery of) the opening area OA, and the second non-display area NDA2 may surround (e.g., around a periphery of) the display area DA. In an embodiment, the first non-display area NDA1 may entirely surround (e.g., around a periphery of) the opening area OA, the display area DA may entirely surround (e.g., around a periphery of) the first non-display area NDA1, and the second non-display area NDA2 may entirely surround (e.g., around a periphery of) the display area DA.

In an embodiment, the display apparatus 1 may be an organic light-emitting display apparatus but the present disclosure is not limited thereto. For example, in other embodiments, the display apparatus 1 may include (or may be) various suitable display apparatuses, for example, such as an inorganic light-emitting display apparatus or quantum-dot light-emitting display apparatus.

Figure 2:
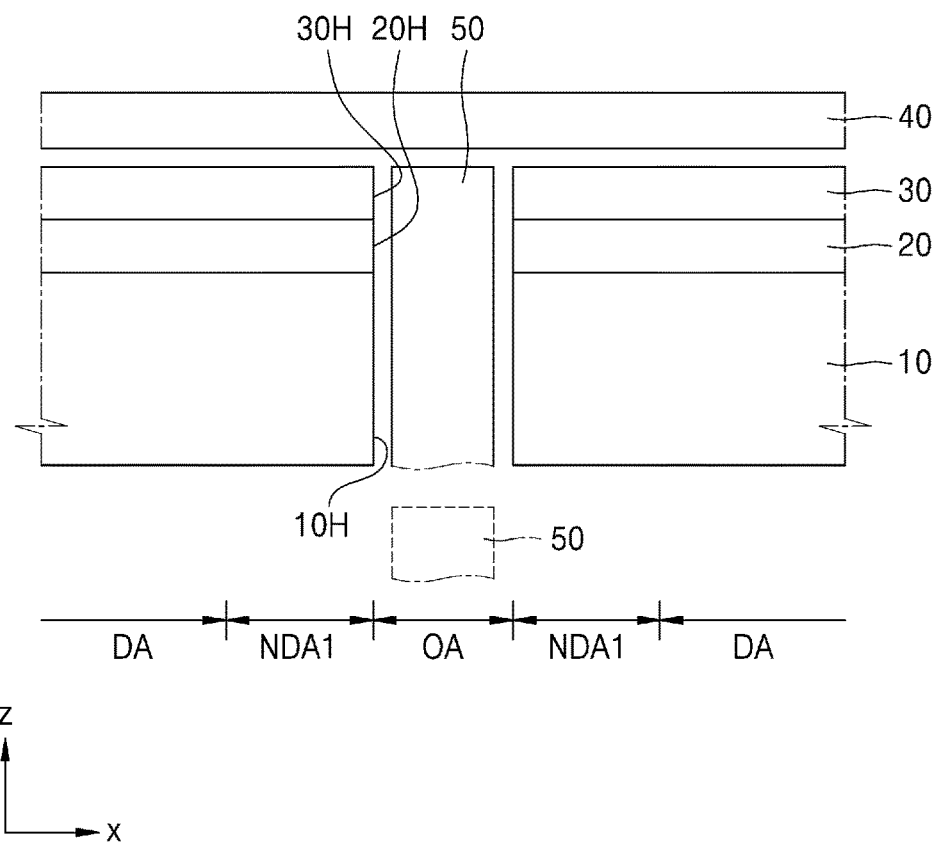
FIG. 2 is a cross-sectional view of a display apparatus according to an embodiment.

FIG. 2 is a cross-sectional view of the display apparatus 1 according to an embodiment taken along the line II-II' of FIG. 1.

Referring to FIG. 2, the display apparatus 1 may include a display panel 10, an input sensing member (e.g., an input sensing layer) 20, and an optical functional member (e.g., an optical functional layer) 30 on the display panel 10. A window 40 may cover the display panel 10, the input sensing member 20, and the optical functional member 30. The display apparatus 1 may include (or may be included in) various suitable electronic apparatuses, for example, such as mobile phones, notebook computers, smartwatches, and/or the like.

The display panel 10 displays an image. The display panel 10 includes pixels arranged at (e.g., in or on) the display area DA. Each of the pixels may include a display element, and a pixel circuit connected to the display element. The display element may include an organic light-emitting diode, an inorganic light-emitting diode, or a quantum-dot light-emitting diode.

The input sensing member 20 obtains coordinate information corresponding to an external input, for example, such as a touch event. The input sensing member 20 may include a sensing electrode (or a touch electrode), and trace lines connected to the sensing electrode. The input sensing member 20 may be arranged on the display panel 10.

The input sensing member 20 may be directly formed on the display panel 10, or may be separately formed and then connected to the display panel 10 through an adhesive layer, for example, such as an optical clear adhesive (OCA). For example, the input sensing member 20 may be successively formed after a process of forming the display panel 10. In this case, the adhesive layer may not be arranged between the input sensing member 20 and the display panel 10. Though it is shown in FIG. 2 that the input sensing member 20 is arranged between the display panel 10 and the optical functional member 30, the input sensing member 20 may be arranged on the optical sensing member 30 in another embodiment.

The optical functional member 30 may include a reflection prevention layer. The reflection prevention layer may reduce the reflectivity of light (e.g., of external light) incident toward the display panel 10 from the outside through the window 40. The reflection prevention layer may include a retarder and a polarizer. The retarder may include a film-type retarder or a liquid crystal-type retarder. The retarder may include a half-wave (λ/2) retarder and/or a quarter-wave (λ/4) retarder. The polarizer may include a film-type polarizer or a liquid crystal-type polarizer. The film-type polarizer may include a stretchable synthetic resin film, and the liquid crystal-type polarizer may include liquid crystals arranged in a suitable (e.g., a predetermined) arrangement. Each of the retarder and the polarizer may further include a protective film. The retarder and the polarizer themselves, or the protective film of the retarder and the polarizer may be defined as a base layer of the reflection prevention layer.

In another embodiment, the reflection prevention layer may include a black matrix and color filters. The color filters may be arranged by taking into account colors of light emitted respectively from the pixels of the display panel 10. In another embodiment, the reflection prevention layer may include a destructive interference structure. The destructive interference structure may include a first reflection layer and a second reflection layer respectively arranged on different layers. First-reflected light and second-reflected light respectively reflected by the first reflection layer and the second reflection layer may create a destructive interference, and thus, the reflectivity of the external light may be reduced.

The optical functional member 30 may include a lens layer. The lens layer may improve the emission efficiency of light emitted from the display panel 10, and/or may reduce color deviation. The lens layer may include a layer having a concave or convex lens shape and/or may include a plurality of layers having different refractive indexes from each other. The optical functional member 30 may include both the reflection prevention layer and the lens layer, or may include one of these layers.

The display panel 10, the input sensing member 20, and the optical functional member 30 may each include an opening. For example, as shown in FIG. 2, the display panel 10, the input sensing member 20, and the optical functional member 30 may include first to third openings 10H, 20H, and 30H, respectively, and the first to third openings 10H, 20H, and 30H may overlap with one another. The first to third openings 10H, 20H, and 30H are arranged to correspond to the opening area OA. In another embodiment, at least one of the display panel 10, the input sensing member 20, and the optical functional member 30 may not include an opening. For example, one or two from among the display panel 10, the input sensing member 20, and the optical functional member 30 may not include an opening.

A component 50 may correspond to the opening area OA. As shown by a solid line in FIG. 2, the component 50 may be arranged inside the first to third openings 10H, 20H, and 30H, or as shown by a dashed line in FIG. 2, the component 50 may be arranged below the display panel 10.

The component 50 may include an electronic element. For example, the component 50 may include an electronic element that uses light or sound. For example, the electronic element may include a sensor such as an infrared sensor that emits and/or receives light, a camera that receives light to capture an image, a sensor that outputs and senses light or sound to measure a distance or to recognize a fingerprint, a small lamp that outputs light, and/or a speaker that outputs sound. In the case of an electronic element that uses light, the electronic element may use light in various wavelength bands, for example, such as visible light, an infrared ray, and/or an ultraviolet ray. In an embodiment, the opening area OA may be understood as a transmission area through which light and/or sound output from the component 50 to the outside and/or progressing toward the electronic element from the outside may pass.

In another embodiment, in the case where the display apparatus 1 is used as a smartwatch or an instrument panel for an automobile, the component 50 may be a member, for example, such as clock hands or a needle indicating desired information (e.g., predetermined information, for example, such as the velocity of a vehicle, and/or the like). In the case where the display apparatus 1 includes clock hands or an instrument panel for an automobile, the component 50 may pass through the window 40 and may be exposed to the outside, for example, such that the window 40 may include an opening corresponding to the opening area OA.

As described above, the component 50 may include one or more elements related to various functions of the display panel 10, or an element such as an accessory that increases the aesthetic sense of the display panel 10.

Figure 3:
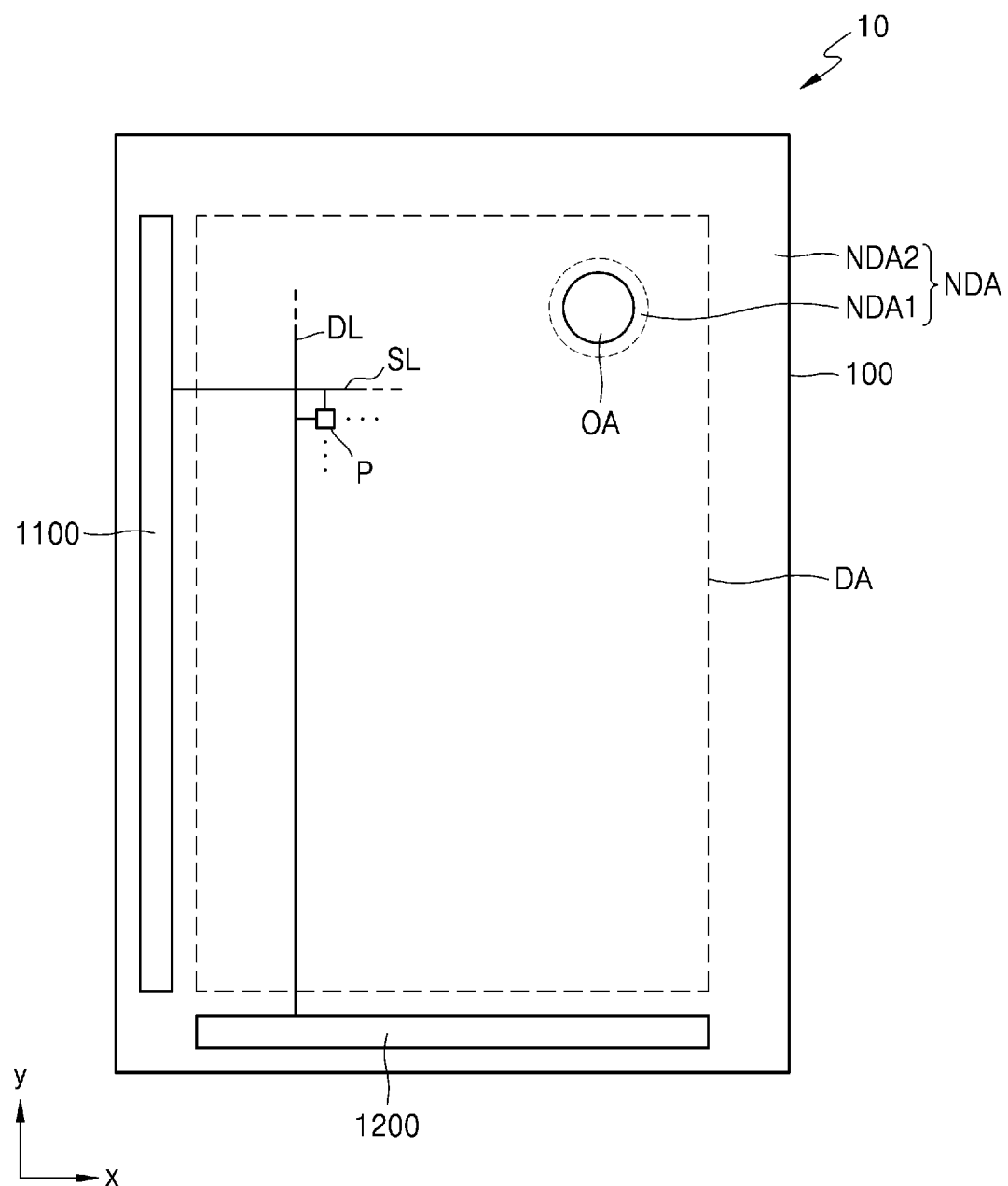
FIG. 3 is a plan view of a display panel according to an embodiment.
Figure 4:
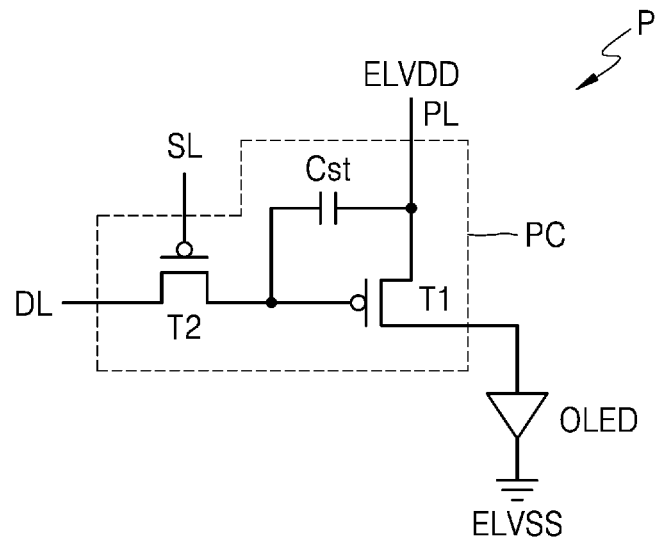
FIG. 4 is an equivalent circuit diagram of a pixel of a display panel.

FIG. 3 is a plan view of the display panel 10 according to an embodiment, and FIG. 4 is an equivalent circuit diagram of a pixel of the display panel 10.

Referring to FIG. 3, the display panel 10 includes the display area DA, the first non-display area NDA1, and the second non-display area NDA2. FIG. 3 may be understood as showing a substrate 100 of the display panel 10. For example, it may be understood that the substrate 100 includes the opening area OA, the display area DA, the first non-display area NDA1, and the second non-display area NDA2.

The display panel 10 includes a plurality of pixels P arranged at (e.g., in or on) the display area DA. As shown in FIG. 4, each pixel P includes a pixel circuit PC, and an organic light-emitting diode OLED as a display element connected to the pixel circuit PC. The pixel circuit PC includes a driving thin film transistor T1, a switching thin film transistor T2, and a storage capacitor Cst. Each pixel P may emit light having, for example, red, green, blue, or white light from the organic light-emitting diode OLED.

The switching thin film transistor T2 is connected to a scan line SL and a data line DL, and transfers a data voltage to the driving thin film transistor T1 in response to a switching voltage input through the scan line SL. The data voltage may be input through the data line DL. The storage capacitor Cst is connected to the switching thin film transistor T2 and a driving voltage line PL, and stores a voltage corresponding to a difference between a voltage transferred from the switching thin film transistor T2 and a first power voltage ELVDD supplied to the driving voltage line PL.

The driving thin film transistor T1 is connected to the driving voltage line PL and the storage capacitor Cst, and may control a driving current flowing through the organic light-emitting diode OLED from the driving voltage line PL in response to the voltage stored in the storage capacitor Cst. The organic light-emitting diode OLED may emit light having a desired brightness (e.g., a certain brightness) according to the driving current. An opposite electrode (e.g. a cathode) of the organic light-emitting diode OLED may receive a second power voltage ELVSS.

Although FIG. 4 shows an example where the pixel circuit PC includes two thin film transistors and one storage capacitor, the present disclosure is not limited thereto. For example, the number of thin film transistors and the number of storage capacitors may be variously modified depending on a structure or a design of the pixel circuit PC.

Referring again to FIG. 3, the first non-display area NDA1 may surround (e.g., around a periphery of) the opening area OA. The first non-display area NDA1 includes a region in which a display element such as an organic light-emitting diode that emits light is not arranged. Signal lines may pass across the first non-display area NDA1, or a recess and a dam described in more detail below may be arranged at (e.g., in or on) the first non-display area NDA1. The signal lines may provide a signal to the pixels P arranged around (e.g., surrounding, adjacent to, or near) the opening area OA. A scan driver 1100, a data driver 1200, a main power line, and/or the like may be arranged at (e.g., in or on) the second non-display area NDA2. The scan driver 1100 may provide a scan signal to each pixel P, the data driver 1200 may provide a data signal to each pixel P, and the main power line may provide the first and second power voltages ELVDD and ELVSS. Although FIG. 4 shows that the data driver 1200 is arranged to be adjacent to one lateral side of the substrate 100, the present disclosure is not limited thereto, and the data driver 1200 may be arranged on a flexible printed circuit board (FPCB) electrically connected to a pad arranged on one side of the display panel 10 in another embodiment.

Figure 5:
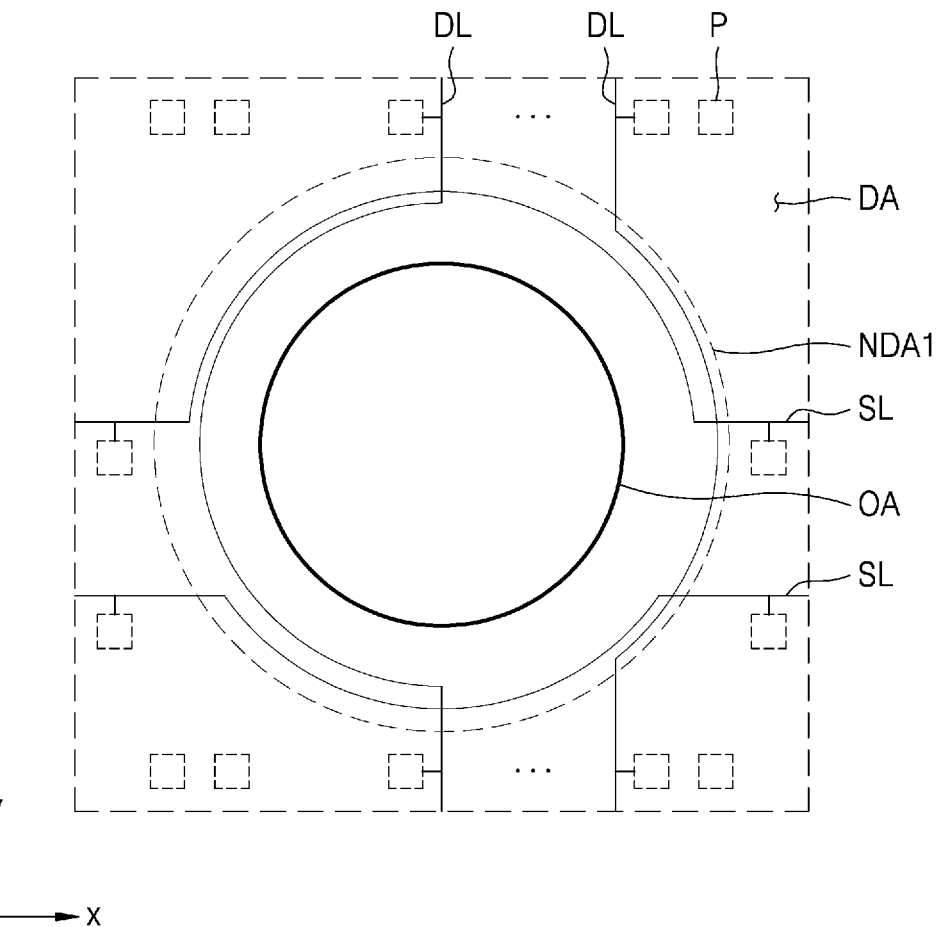
FIG. 5 is a view of signal lines arranged in a first non-display area of a display panel according to an embodiment.

FIG. 5 is a plan view of a portion of the display panel 10 according to an embodiment, and shows signal lines arranged at (e.g., in or on) the first non-display area NDA1.

Referring to FIG. 5, pixels P are arranged at (e.g., in or on) the display area DA around (e.g., surrounding, adjacent to, or near) the opening area OA, and the first non-display area NDA1 may be arranged between the opening area OA and the display area DA.

The pixels P may be spaced apart from one another with the opening area OA therebetween. The pixels P may be vertically (e.g., in a y-direction) spaced apart from one another with the opening area OA therebetween, and/or may be horizontally (e.g., in an x-direction) spaced apart from one another with the opening area OA therebetween.

From among the signal lines configured to supply a signal to the pixels P, the signal lines adjacent to (e.g., neighboring or surrounding a periphery of) the opening area OA may detour (e.g., may extend around a periphery of) the opening area OA. Some of the data lines DL passing across the display area DA may extend in a y-direction to provide a data signal to the pixels P that are vertically arranged with the opening area OA therebetween, and may detour along the edge of (e.g., may extend partially around a periphery of) the opening area OA at (e.g., in or on) the first non-display area NDA1. Some of the scan lines SL passing across the display area DA may extend in an x-direction to provide a scan signal to the pixels P that are horizontally arranged with the opening area OA therebetween, and may detour along the edge of (e.g., may extend partially around a periphery of) the opening area OA at (e.g., in or on) the first non-display area NDA1.

Figure 6:
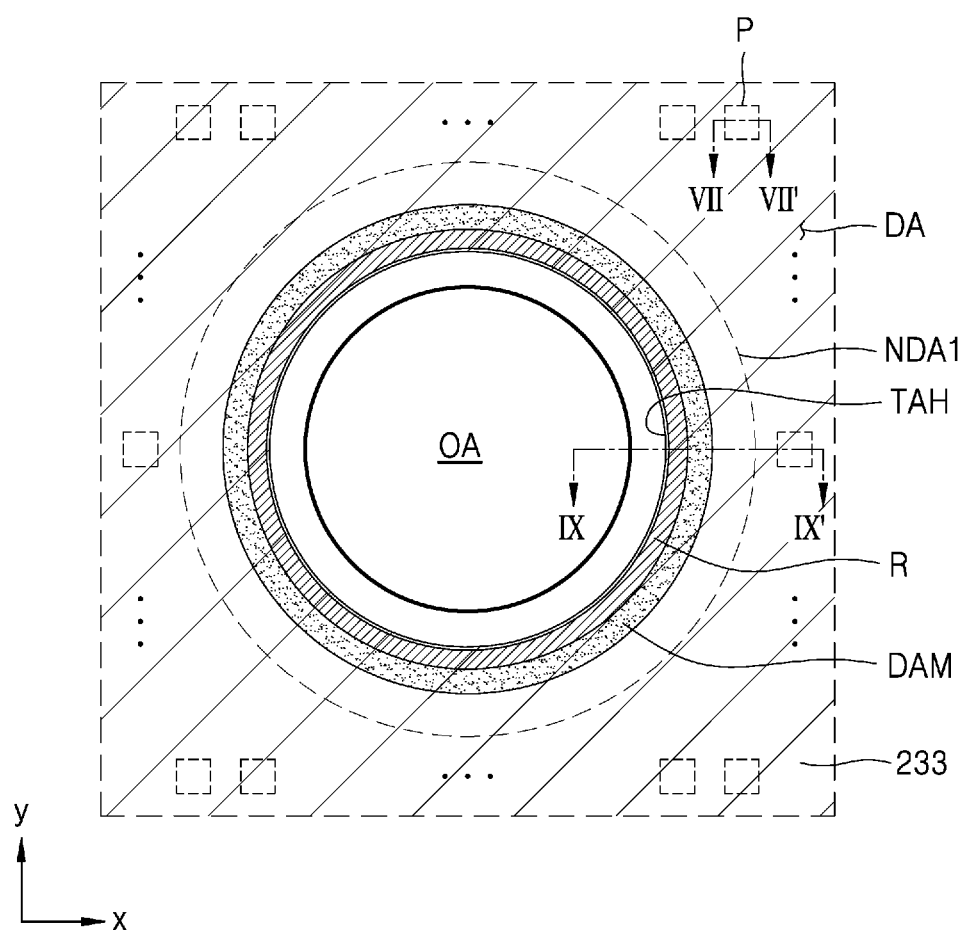
FIG. 6 is a view of a recess arranged in a first non-display area of a display panel according to an embodiment.

FIG. 6 is a plan view of a portion of the display panel 10 according to an embodiment, and shows a recess R and a dam DAM arranged at (e.g., in or on) the first non-display area NDA1. In addition, FIG. 6 shows an opposite electrode 223 arranged at (e.g., in or on) the first non-display area NDA1.

At least one dam DAM may be arranged between the opening area OA and the display area DA. The recess R may be arranged between the dam DAM and the opening area OA. In some embodiments, the dam DAM may be provided in a plurality, and in this case, the recess R may be arranged on one side of a dam DAM that is adjacent to (e.g., closest to) the opening area OA from among the plurality of dams DAM. As used in the present specification, the dam DAM denotes an element protruding with respect to a reference surface, and the recess R denotes an element recessed with respect to the reference surface. For example, the reference surface may include a top surface of one of insulating layers arranged on the substrate 100. In other words, the dam DAM may include an element protruding from the top surface of a first insulating layer, and the recess R may include an element recessed in a depth direction of the first insulating layer.

Because a region between the recess R and the opening area OA is a region from which first and second functional layers 222a and 222c (e.g., see FIG. 7A) and the opposite electrode 223 are removed, the penetration of moisture, external air, and/or the like through the opening area OA may be prevented or substantially prevented. In other words, the first and second functional layers 222a and 222c and the opposite electrode 223 may each include a transmission hole TAH exposing the opening area OA and a portion of the first non-display area NDA1 around (e.g., surrounding around a periphery of) the opening area OA. For example, the transmission hole TAH may expose the portion of the first non-display area NDA1 between the recess R and the opening area OA. A boundary or a lateral wall of the transmission hole TAH may be designed to meet an inner lateral wall of the recess R.

As described in more detail below, the recess R may include an element configured to efficiently remove the first and second functional layers 222a and 222c and the opposite electrode 223 (e.g., see FIG. 7A) by using a laser lift process.

The dam DAM and the recess R may each have a ring shape entirely surrounding (e.g., around a periphery of) the opening area OA at (e.g., in or on) the first non-display area NDA1. A diameter of each of the dam DAM and the recess R may be greater than a diameter of the opening area OA. In a plan view, the dam DAM and the recess R each surrounding (e.g., around a periphery of) the opening area OA may be adjacent to (e.g., may neighbor) each other.

Figure 7A:
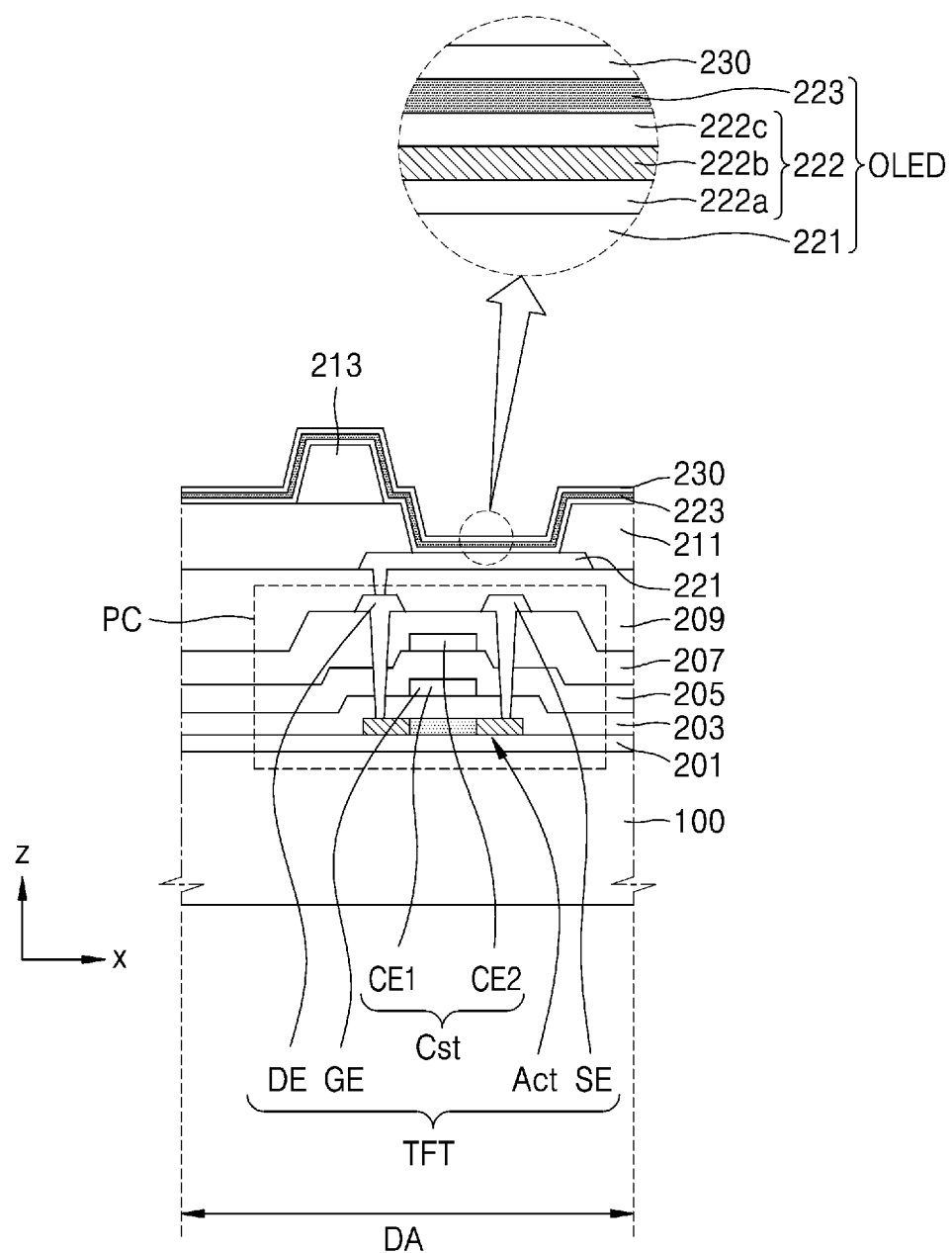
FIGS. 7A and 7B are cross-sectional views of a pixel of a display panel according to one or more example embodiments.

FIG. 7A is a cross-sectional view of a pixel of the display panel 10 according to an embodiment taken along the line VII-VII' of FIG. 6.

Referring to FIG. 7A, a pixel circuit PC and an organic light-emitting diode OLED may be arranged at (e.g., in or on) the display area DA. The organic light-emitting diode OLED may be electrically connected to the pixel circuit PC.

A thin film transistor TFT and a storage capacitor Cst may each be located over the substrate 100, and may be electrically connected to a pixel electrode 221. The pixel circuit PC may be arranged over the substrate 100. The organic light-emitting diode OLED may be arranged on the pixel circuit PC.

The substrate 100 may include a polymer resin or glass. In an embodiment, the substrate 100 may include a polymer resin, for example, such as polyethersulfone, polyarylate, polyetherimide, polyethylene naphthalate, polyethylene terephthalate, polyphenylene sulfide, polyimide, polycarbonate, cellulose tri-acetate, and/or cellulose acetate propionate, and may be flexible. The substrate 100 may include glass having $SiO_2$ as a main component, or may include a resin, for example, such as a reinforced plastic, and may be rigid.

A buffer layer 201 may be formed on the substrate 100. The buffer layer 201 may prevent or substantially prevent impurities from penetrating into a first semiconductor layer Act of a first thin film transistor TFT. The buffer layer 201 may include an inorganic material, for example, such as oxide or nitride, an organic material, or an organic/inorganic composite material, and may have a single-layer structure or a multi-layered structure including an inorganic material and an organic material. In some embodiments, a barrier layer may be further included between the substrate 100 and the buffer layer 201. In this case, the barrier layer may block or substantially block the penetration of external air. In an embodiment, the buffer layer 201 may include silicon oxide ($SiO_2$) or silicon nitride ($SiN_x$).

The pixel circuit PC may be arranged on the buffer layer 201. The pixel circuit PC includes the first thin film transistor TFT and the storage capacitor Cst. The first thin film transistor TFT may include the first semiconductor layer Act, a first gate electrode GE, a first source electrode SE, and a first drain electrode DE. The first thin film transistor TFT shown in FIG. 7A may correspond to the driving thin film transistor described with reference to FIG. 4. Although the present embodiment shows a top-gate type thin film transistor in which the first gate electrode GE is arranged over the first semiconductor layer Act with a first gate insulating layer 203 therebetween, in another embodiment, the first thin film transistor TFT may include a bottom-gate type thin film transistor.

The first semiconductor layer Act may include polycrystalline silicon (poly-Si). However, the present disclosure is not limited thereto, and the first semiconductor layer Act may include amorphous silicon, an oxide semiconductor, or an organic semiconductor. The first gate electrode GE may include a low-resistance metal material. The first gate electrode GE may include a conductive material including, for example, molybdenum (Mo), aluminum (Al), copper (Cu), and/or titanium (Ti), and may include a single layer structure or a multi-layered structure including one or more of the above materials.

The first gate insulating layer 203 between the first semiconductor layer Act and the first gate electrode GE may include an inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 203 may include a single layer structure or a multi-layered structure including one or more of the above materials.

The first source electrode SE and the first drain electrode DE may include a material having a suitable conductivity (e.g., an excellent conductivity). The first source electrode SE and the first drain electrode DE may include a conductive material including, for example, molybdenum (Mo), aluminum (Al), copper (Cu), and/or titanium (Ti), and may include a single layer structure or a multi-layered structure including one or more of the above materials. In an embodiment, the first source electrode SE and the first drain electrode DE may include a multi-layered structure of Ti/Al/Ti.

The storage capacitor Cst includes a bottom electrode CE1 and a top electrode CE2 overlapping with each other with a second gate insulating layer 205 therebetween. The storage capacitor Cst may overlap with the thin film transistor TFT. For example, as shown in FIG. 7A, the first gate electrode GE of the first thin film transistor TFT may serve as the bottom electrode CE1 of the storage capacitor Cst. However, the present disclosure is not limited thereto, and in another embodiment, the storage capacitor Cst may not overlap with the first thin film transistor TFT.

The top electrode CE2 of the storage capacitor Cst may include a conductive material including, for example, molybdenum (Mo), aluminum (Al), copper (Cu), and/or titanium (Ti), and may include a single layer structure or a multi-layered structure including one or more of the above materials. In an embodiment, the top electrode CE2 may include a first layer and a second layer arranged on the first layer, the first layer including titanium (Ti), and the second layer including molybdenum (Mo). As described in more detail below, because the first layer of the top electrode CE2 may be concurrently (e.g., simultaneously) formed with a sacrificial layer described in more detail below, and may include the same material as that of the sacrificial layer, an additional process of separately forming the sacrificial layer may be reduced.

In another embodiment, the bottom electrode CE1 may include a first layer and a second layer arranged on the first layer, the first layer including titanium (Ti), and the second layer including molybdenum (Mo). Because the first layer of the bottom electrode CE1 may be concurrently (e.g., simultaneously) formed with a sacrificial layer described in more detail below, and may include the same material as that of the sacrificial layer, an additional process of separately forming the sacrificial layer may be reduced.

The second gate insulating layer 205 may serve as a dielectric of the storage capacitor Cst. The second gate insulating layer 205 may include an inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 205 may include a single layer structure or a multi-layered structure including one or more of the above materials.

The storage capacitor Cst may be covered by an interlayer insulating layer 207. The interlayer insulating layer 207 may include an inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 207 may include a single layer structure or a multi-layered structure including one or more of the above materials.

The pixel circuit PC including the first thin film transistor TFT and the storage capacitor Cst may be covered by a planarization layer 209. The planarization layer 209 may include a flat or substantially flat (e.g., an approximately flat) top surface. The planarization layer 209 may include an organic insulating material including, for example, a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the planarization layer 209 may include polyimide. In another embodiment, the planarization layer 209 may include an inorganic insulating material, or may include an inorganic insulating material and an organic insulating material.

The pixel electrode 221 may be arranged on the planarization layer 209. The pixel electrode 221 may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including, for example, silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 221 may further include a layer including, for example, ITO, IZO, ZnO, or In$_2$O$_3$ on/under the reflective layer. In this case, for example, the pixel electrode 221 may have a stacked structure of ITO/Ag/ITO.

A pixel-defining layer 211 may be arranged on the pixel electrode 221. The pixel-defining layer 211 may include an opening exposing a top surface of the pixel electrode 221, and may cover edges (e.g., opposite edges) of the pixel electrode 221. Therefore, the pixel-defining layer 211 may define an emission area of a pixel. The pixel-defining layer 211 may include an organic insulating material. For example, the pixel-defining layer 211 may be formed through a spin coating process, and/or the like by using an organic insulating material, for example, such as polyimide, polyamide, an acrylic resin, benzocyclobutene, hexamethyldisiloxane (HMDSO), and/or a phenolic resin.

An intermediate layer 222 may include an emission layer 222b. The intermediate layer 222 may include the first functional layer 222a and/or the second functional layer 222c, the first functional layer 222a being under the emission layer 222b, and the second functional layer 222c being on the emission layer 222b. The emission layer 222b may include a polymer organic material or a low molecular weight organic material for emitting light having a desired color (e.g., a certain color).

The first functional layer 222a may include a single layer structure or a multi-layered structure. For example, in the case where the first functional layer 222a includes a polymer material, the first functional layer 222a may include a hole transport layer (HTL), which has a single-layered structure, and may include poly(3,4-ethylenedioxythiophene) (PEDOT) or polyaniline (PANI). In the case where the first functional layer 222a includes a low molecular weight material, the first functional layer 222a may include a hole injection layer (HIL) and an HTL.

The second functional layer 222c may be omitted. For example, in the case where the first functional layer 222a and the emission layer 222b include a polymer material, the second functional layer 222c may be formed. The second functional layer 222c may include a single layer structure or a multi-layered structure. The second functional layer 222c may include an electron transport layer (ETL) and/or an electron injection layer (EIL).

The emission layer 222b of the intermediate layer 222 may be arranged for each pixel at (e.g., in or on) the display area DA. The emission layer 222b may contact a top surface of the pixel electrode 221 exposed through the opening of the pixel-defining layer 211. The first and second functional layers 222a and 222c of the intermediate layer 222 may be formed not only at (e.g., in or on) the display area DA of FIG. 7A, but may also be formed at (e.g., in or on) the first non-display area NDA1.

The opposite electrode 223 may include a conductive material having a low work function. For example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. In another embodiment, the opposite electrode 223 may further include a layer on the (semi) transparent layer, the layer including, for example, ITO, IZO, ZnO, or In$_2$O$_3$. The opposite electrode 223 may be formed not only at (e.g., in or on) the display area DA, but may also be formed at (e.g., in or on) the first non-display area NDA1. The intermediate layer 222 and the opposite electrode 223 may be formed, for example, by thermal deposition.

A spacer 213 may be formed on the pixel-defining layer 211. The spacer 213 may include an organic insulating material, for example, such as polyimide. The spacer 213 may include a material different from that of the pixel-defining layer 211. In another embodiment, the spacer 213 may include the same material as that of the pixel-defining layer 211. In this case, the pixel-defining layer 211 and the spacer 213 may be concurrently (e.g., simultaneously) formed during a mask process that uses a half-tone mask. In an embodiment, the pixel-defining layer 211 and the spacer 213 may include polyimide.

A capping layer 230 may be arranged on the opposite electrode 223. The capping layer 230 may be a layer configured to protect the opposite electrode 223, and may include lithium fluoride (LiF), an inorganic material, and/or an organic material. However, the present disclosure is not limited thereto, and in another embodiment, the capping layer 230 may be omitted.

Figure 7B:
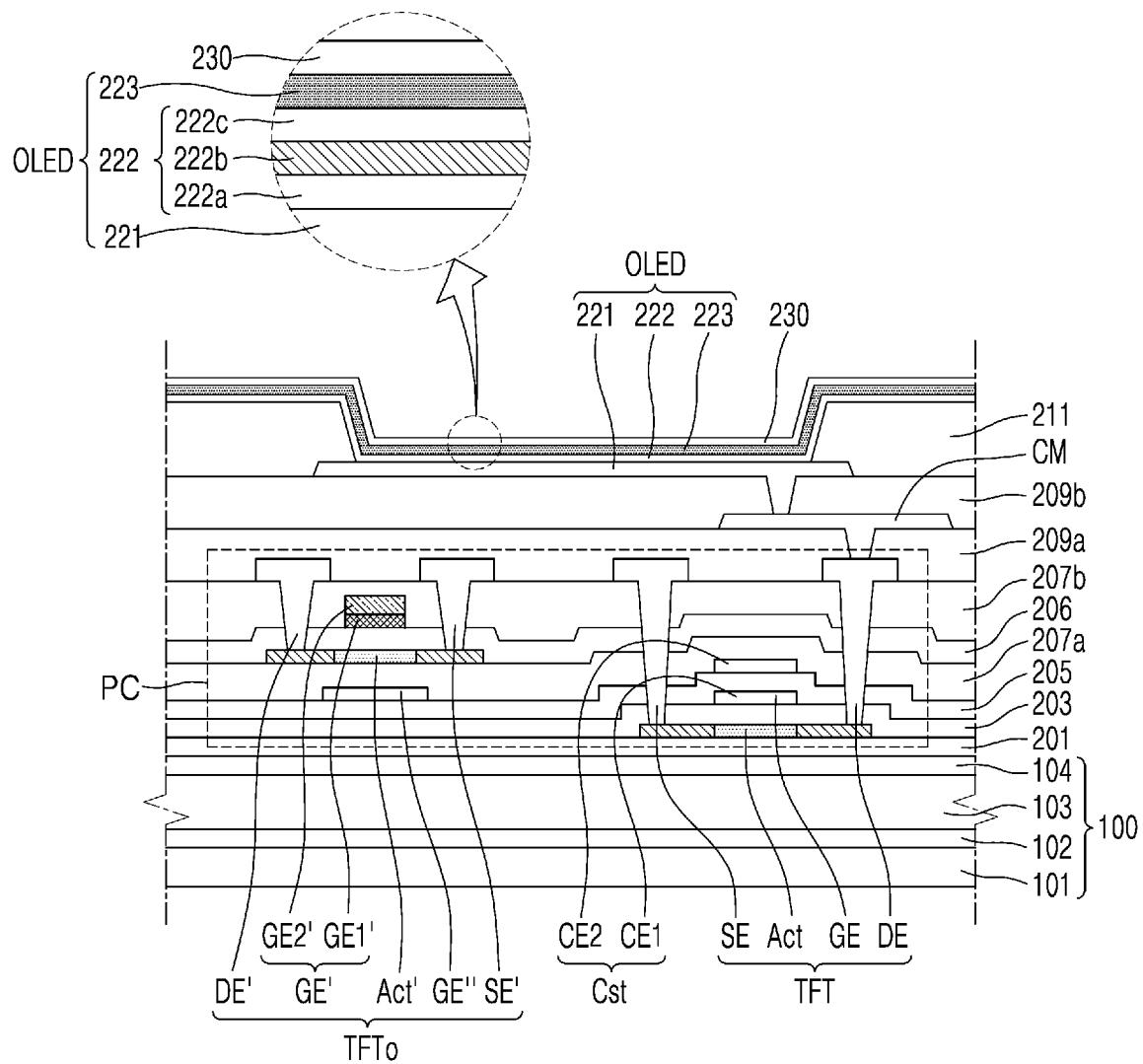

FIG. 7B is a cross-sectional view of a pixel of the display panel 10 according to an embodiment taken along the line VII-VII' of FIG. 6. In FIG. 7B, because the same reference numerals are used to denote the same or substantially the same elements as those of FIG. 7A, redundant descriptions thereof may not be repeated.

Referring to FIG. 7B, the pixel circuit PC and the organic light-emitting diode OLED may be arranged at (e.g., in or on) the display area DA. The organic light-emitting diode OLED may be electrically connected to the pixel circuit PC. The embodiment of FIG. 7B is different from the embodiment of FIG. 7A in that the pixel circuit PC includes a thin film transistor including an oxide semiconductor, and a thin film transistor including polycrystalline silicon.

Referring to FIG. 7B, the pixel circuit PC of the display panel 10 may include the first thin film transistor TFT including a semiconductor layer Act including polycrystalline silicon, and a second thin film transistor TFTo including a semiconductor layer Act' including an oxide semiconductor.

The first thin film transistor TFT includes the first semiconductor layer Act, a first gate electrode GE, a first source electrode SE, and a first drain electrode DE. The first thin film transistor TFT is the same or substantially the same as the first thin film transistor TFT described with reference to FIG. 7A, and the first semiconductor layer Act of the first thin film transistor TFT may include polycrystalline silicon.

The present embodiment includes a first interlayer insulating layer 207a, a second interlayer insulating layer 207b, a first planarization layer 209a, and a second planarization layer 209b. In addition, the substrate 100 may have a multi-layered structure.

The substrate 100 may include a first base layer 101, a first inorganic barrier layer 102, a second base layer 103, and a second inorganic barrier layer 104 that are sequentially stacked on one another. The first base layer 101 and the second base layer 103 may each include a polymer resin. The first inorganic barrier layer 102 and the second inorganic barrier layer 104 may include various suitable barrier layers configured to prevent or substantially prevent the penetration of impurities from the outside, may include an inorganic material, for example, such as silicon oxide (SiO$_2$), silicon nitride (SiN$_x$), and/or silicon oxynitride (SiO$_x$N$_y$), and may have a single-layer structure or a multi-layered structure.

The second thin film transistor TFTo may include the second semiconductor layer Act', a second gate electrode GE', a second source electrode SE', and a second drain electrode DE'. The second thin film transistor TFTo may further include a bottom gate electrode GE".

The second semiconductor layer Act' may be arranged on the first interlayer insulating layer 207a. In other words, the second semiconductor layer Act' may be arranged at (e.g., in or on) a different layer from that of the first semiconductor layer Act. The second semiconductor layer Act' may include a channel region, a source region, and a drain region. The source region and the drain region may be respectively arranged on two opposite sides of the channel region. In an embodiment, the second semiconductor layer Act' may include an oxide semiconductor. For example, the second semiconductor layer Act' may include a Zn-oxide-based material such as Zn-oxide, In—Zn oxide, and/or Ga—In—Zn oxide. As another example, the second semiconductor layer Act' may include In-Ga—Zn-O (IGZO), In—Sn—Zn—O (ITZO), or In—Ga—Sn—Zn—O (IGTZO) semiconductor containing metal, for example, such as indium (In), gallium (Ga), and/or stannum (Sn) in ZnO.

The source region and the drain region of the second semiconductor layer Act' may be formed by adjusting a carrier concentration of an oxide semiconductor, and making the source region and the drain region conductive. For example, the source region and the drain region of the second semiconductor layer Act' may be formed by increasing a carrier concentration through plasma treatment that uses a hydrogen (H)-based gas, a fluorine (F)-based gas, or a combination thereof performed on the oxide semiconductor.

The second gate electrode GE' may overlap with the channel region of the second semiconductor layer Act'. A third gate insulating layer 206 may be arranged between the second semiconductor layer Act' and the second gate electrode GE'. In other words, the second gate electrode GE' may be insulated from the second semiconductor layer Act' by the third gate insulating layer 206. Although FIG. 7B shows that the third gate insulating layer 206 is provided over an entire top surface of the substrate 100, the present disclosure is not limited thereto, and the third gate insulating layer 206 may be patterned along the shape of the second gate electrode GE'.

The second gate electrode GE' may include a conductive material including, for example, molybdenum (Mo), aluminum (Al), copper (Cu), and/or titanium (Ti), and may include a single layer structure or a multi-layered structure including one or more of the above materials. In the present embodiment, the second gate electrode GE' may include a first layer GE1' and a second layer GE2'. The first layer GE1' may include titanium (Ti), and the second layer GE2' may include molybdenum (Mo). In this case, the thickness (e.g., in a direction perpendicular to or substantially perpendicular to a top surface of the substrate 100) of the first layer GE1' may be less than the thickness of the second layer GE2'. In an embodiment, the thickness of the first layer GE1' may be about 70 Å to about 300 Å. As described in more detail below, because the first layer GE1' may be concurrently (e.g., simultaneously) formed with a sacrificial layer described in more detail below by using the same material as that of the sacrificial layer, an additional process of separately forming the sacrificial layer may be reduced.

The third gate insulating layer 206 may include an inorganic material including, for example, oxide or nitride. For example, the third gate insulating layer 206 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate electrode GE' may be arranged on the third gate insulating layer 206, may include at least one of molybdenum (Mo), copper (Cu), and/or titanium (Ti), and may include a single layer structure or a multi-layered structure.

The bottom gate electrode GE" may be arranged below the second semiconductor layer Act' to overlap with a channel region of the second semiconductor layer Act'. The bottom gate electrode GE" may be arranged at (e.g., in or on) the same layer as that of the top electrode CE2 of the storage capacitor Cst. The first interlayer insulating layer 207a may be arranged between the bottom gate electrode GE" and the second semiconductor layer Act'.

The second interlayer insulating layer 207b may cover the second gate electrode GE' of the second thin film transistor TFTo, and may be arranged over the top surface of the substrate 100. The second source electrode SE', and the second drain electrode DE' may be arranged on the second interlayer insulating layer 207b.

The first interlayer insulating layer 207a and the second interlayer insulating layer 207b may include an inorganic material including, for example, oxide or nitride. For example, the first interlayer insulating layer 207a and the second interlayer insulating layer 207b may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$).

The second source electrode SE' and the second drain electrode DE' may respectively contact the source region and the drain region of the second semiconductor layer Act' through contact holes passing through the second interlayer insulating layer 207b. The second source electrode SE' and the second drain electrode DE' may include a conductive material including, for example, molybdenum (Mo), aluminum (Al), copper (Cu), and/or titanium (Ti), and may include a single layer structure or a multi-layered structure including one or more of the above materials.

Because a thin film transistor including a semiconductor layer including polycrystalline silicon has a high reliability, the thin film transistor may be employed as the driving thin film transistor to implement a high-quality display panel.

Because an oxide semiconductor has a high carrier mobility and a low leakage current, a voltage drop may not be large even when a driving time is long. In other words, because a color change of an image according to a voltage drop may not be large even during low-frequency driving, a display panel may be driven at low frequencies. Because an oxide semiconductor may have a low leakage current as described above, a leakage current may be prevented or substantially prevented, and accordingly, power consumption may be reduced by employing an oxide semiconductor as at least one of the other thin film transistors in addition to the driving thin film transistor.

The first planarization layer 209a and the second planarization layer 209b may be provided on the second interlayer insulating layer 207b. Therefore, because conductive patterns such as wirings may be formed between the first planarization layer 209a and the second planarization layer 209b, high integration may be provided.

The first planarization layer 209a may be arranged to cover the pixel circuit PC. The second planarization layer 209b may be arranged on the first planarization layer 209a, and may have a flat or a substantially flat top surface such that the pixel electrode 221 may be formed to be flat or substantially flat. The first planarization layer 209a and the second planarization layer 209b may include an organic material or an inorganic material, and may have a single-layer structure or a multi-layered structure. The first planarization layer 209a and the second planarization layer 209b may include, for example, a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer. The first planarization layer 209a and the second planarization layer 209b may include an inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). While the first planarization layer 209a and the second planarization layer 209b are formed, in order to provide a flat or a substantially flat top surface, chemical mechanical polishing may be performed on a top surface thereof after the first planarization layer 209a and the second planarization layer 209b are formed.

The organic light-emitting diode OLED may be arranged on the second planarization layer 209b. The pixel electrode 221 of the organic light-emitting diode OLED may be connected to the pixel circuit PC through a connection metal CM arranged on the first planarization layer 209a.

The connection metal CM may be arranged between the first planarization layer 209a and the second planarization layer 209b. The connection metal CM may include a conductive material including, for example, molybdenum (Mo), aluminum (Al), copper (Cu), and/or titanium (Ti), and may include a single layer structure or a multi-layered structure including one or more of the above materials. For example, in some embodiments, the connection metal CM may have a multi-layered structure of Ti/Al/Ti.

Figure 8:
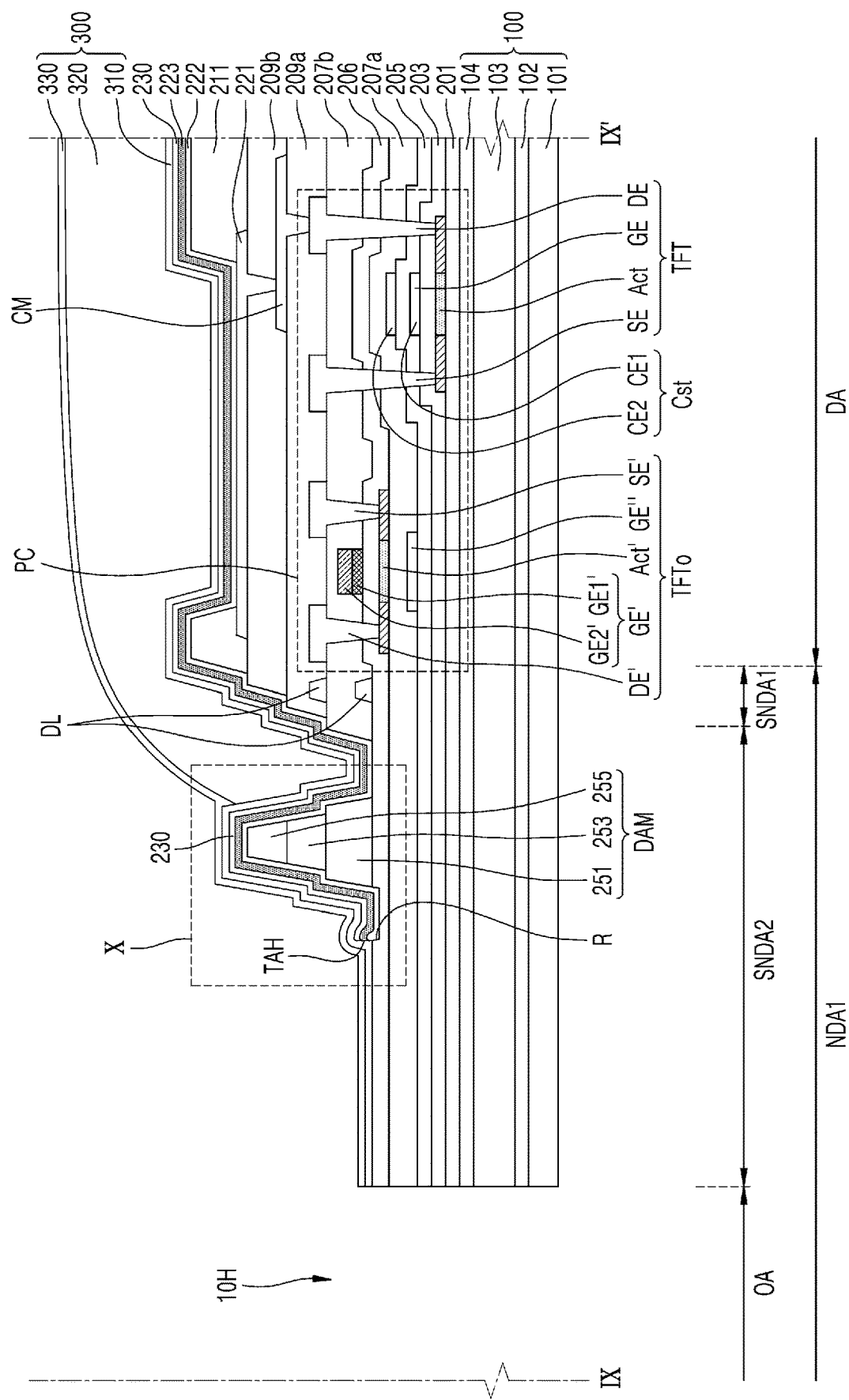
FIG. 8 is a cross-sectional view of a display panel according to an embodiment.
Figure 9:
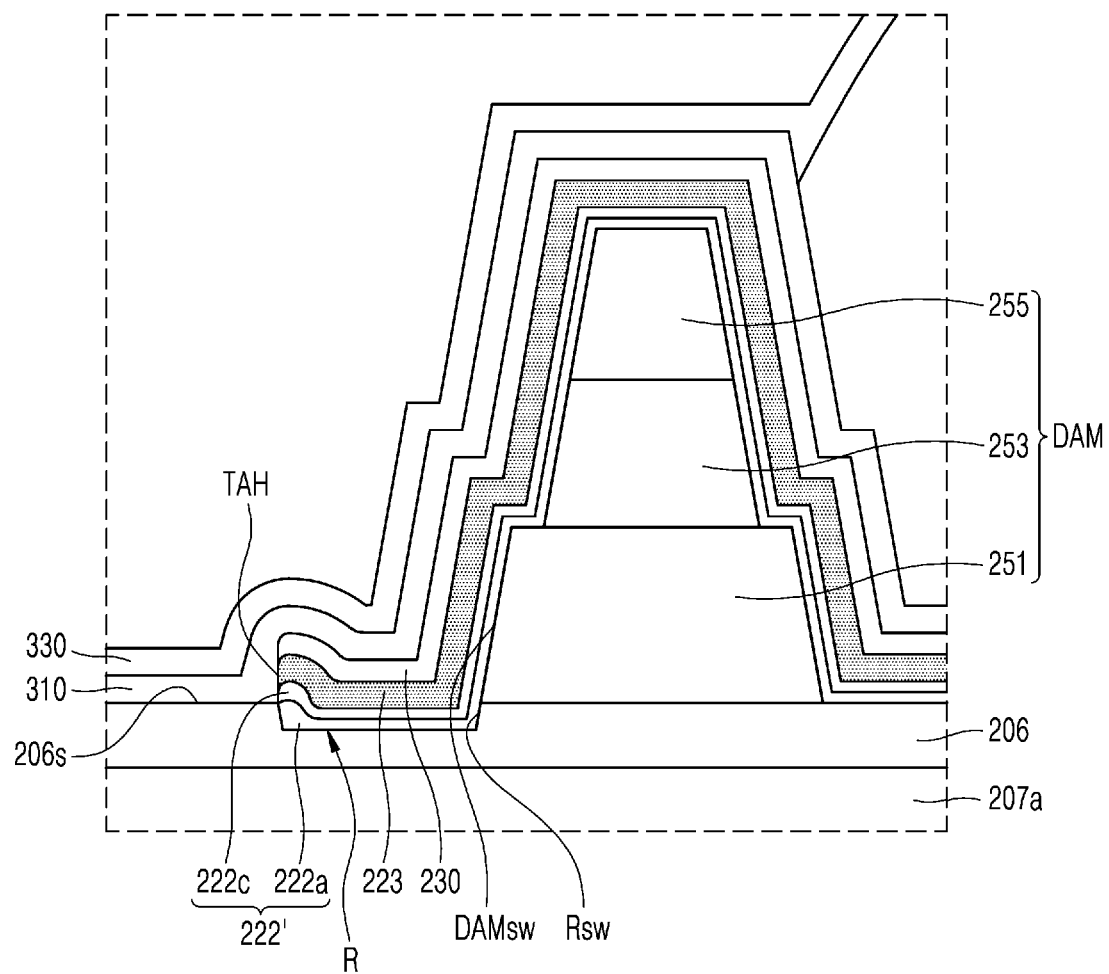
FIG. 9 is an enlarged cross-sectional view of the region X of FIG. 8.

FIG. 8 is a cross-sectional view of the display panel 10 according to an embodiment, and FIG. 9 is an enlarged cross-sectional view of a region of the display panel 10 at (e.g., in or on) which a recess is arranged. FIG. 8 may correspond to a cross-section of the display panel 10 taken along line the IX-IX' of FIG. 6, and FIG. 9 is an enlarged cross-sectional view of the region X of FIG. 8.

Referring to FIG. 8, the display panel 10 includes the opening area OA, the display area DA, and the first non-display area NDA1 therebetween. The display panel 10 may include the first opening 10H corresponding to the opening area OA.

As shown in FIG. 8, in some embodiments, the display panel 10 may employ (e.g., may include) the pixel circuit PC shown in FIG. 7B. While FIG. 8 shows an embodiment of the display panel 10 employing (e.g., including) the pixel circuit PC shown in FIG. 7B for convenience of illustration and related description thereof, the present disclosure is not limited thereto.

Referring to the display area DA of FIG. 8, the first thin film transistor TFT, the second thin film transistor TFTo, and the storage capacitor Cst may be arranged at (e.g., in or on) the display area DA.

The insulating layers 201 to 209b may be arranged between the semiconductor layers and the electrodes of the first thin film transistor TFT and the second thin film transistor TFTo, and between the electrodes of the storage capacitor Cst. The pixel electrode 221, the intermediate layer 222, the opposite electrode 223, and the capping layer 230 may be arranged at (e.g., in or on) the display area DA, and the pixel electrode 221 may be electrically connected to the pixel circuit PC. The above elements are the same or substantially the same as those described with reference to FIG. 7B, and thus, redundant descriptions thereof may not be repeated.

The display element including the pixel electrode 221, the intermediate layer 222, and the opposite electrode 223 may be covered by a thin-film encapsulation layer 300. The thin-film encapsulation layer 300 may include at least one organic encapsulation layer and at least one inorganic encapsulation layer. For example, as shown in FIG. 8, in some embodiments, the thin-film encapsulation layer 300 may include first and second inorganic encapsulation layers 310 and 330, and an organic encapsulation layer 320 between the first and second inorganic encapsulation layers 310 and 330. However, the present disclosure is not limited thereto, and in another embodiment, the number of organic encapsulation layers, the number of inorganic encapsulation layers, and a stacking sequence (e.g., a stacking order) may be variously modified as needed or desired.

The first and second inorganic encapsulation layers 310 and 330 may include at least one inorganic insulating material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$), and be formed by chemical vapor deposition (CVD), and/or the like. The organic encapsulation layer 320 may include, for example, a polymer-based material. The polymer-based material may include, for example, a silicon-based resin, an acryl-based resin, an epoxy-based resin, polyimide, and/or polyethylene.

Referring to the first non-display area NDA1 of FIG. 8, the first non-display area NDA1 may include a first sub-non-display area SNDA1 and a second sub-non-display area SNDA2. The first sub-non-display area SNDA1 may be relatively close to (e.g., may be adjacent to) the display area DA, and the second sub-non-display area SNDA2 may be relatively close to (e.g., may be adjacent to) the opening area OA or the first opening 10H. For example, the first sub-non-display area SNDA1 may be between the second sub-non-display area SNDA2 and the display area DA, and the second sub-non-display area SNDA2 may be between the first sub-non-display area SNDA1 and the opening area OA or the first opening 10H.

The first sub-non-display area SNDA1 may include a region across which the data lines DL described with reference to FIG. 5 pass (e.g., extend across). The data lines DL shown in FIG. 8 may correspond to data lines detouring (e.g., extending around a periphery of) the opening area OA. The first sub-non-display area SNDA1 may include a wiring region or a detouring region across which the data lines DL pass.

In some embodiments, the data lines DL may be alternately arranged with the insulating layer therebetween as shown in FIG. 8. In another embodiment, the data lines DL may be arranged at (e.g., in or on) the same insulating layer as each other. In the case where the data lines DL adjacent to (e.g., neighboring) each other are vertically arranged with an insulating layer therebetween, an interval (e.g., a pitch) between the data lines adjacent to (e.g., neighboring) each other may be reduced, and the width of the first non-display area NDA1 may be reduced. Although FIG. 8 shows that the data lines DL are arranged at (e.g., in or on) the first sub-non-display area SNDA1, the scan lines detouring (e.g., extending around a periphery of) the opening area OA described with reference to FIG. 5 may be also arranged at (e.g., in or on) the first sub-non-display area SNDA1.

The second sub-non-display area SNDA2 may be a region in which the organic material between the substrate 100 and the thin-film encapsulation layer 300 is removed, and may include a region at (e.g., in or on) which the recess R and the dam DAM are arranged. The recess R is concave with respect to a reference surface, and the dam DAM protrudes from the reference surface. In an embodiment, as shown in FIG. 8, the recess R and the dam DAM may be provided with respect to the top surface of the third gate insulating layer 206 serving as the reference surface.

Referring to the second sub-non-display area SNDA2 of FIG. 8 and FIG. 9, the recess R may be concave with respect to a top surface 206S of the third gate insulating layer 206, and the dam DAM may protrude from the top surface 206S of the third gate insulating layer 206.

The recess R may be formed by removing a portion of the third gate insulating layer 206. Although FIGS. 8 and 9 show that the recess R is not formed in the first interlayer insulating layer 207a, the present disclosure is not limited thereto. For example, in another embodiment, the recess R may be formed by removing a portion of the third gate insulating layer 206 and a portion of the first interlayer insulating layer 207a.

The dam DAM may include a plurality of layers that are stacked on one another. For example, the dam DAM may include a first layer 251, a second layer 253, and a third layer 255 that are stacked on one another. The first layer 251 may be arranged at (e.g., in or on) the same layer as that of the second interlayer insulating layer 207b, and may include the same material as that of the second interlayer insulating layer 207b. The second layer 253 may be arranged on the first layer 251, may be arranged at (e.g., in or on) the same layer as that of the first planarization layer 209a, and may include the same material as that of the first planarization layer 209a. The third layer 255 may be arranged on the second layer 253, may be arranged at (e.g., in or on) the same layer as that of the second planarization layer 209b, and may include the same material as that of the second planarization layer 209b. The dam DAM may include an element configured to control the flow of the organic encapsulation layer 320 while the organic encapsulation layer 320 of the thin-film encapsulation layer 300 is formed.

The dam DAM and the recess R may be successively arranged. For example, one lateral wall DAMsw of a bottom end of the dam DAM may constitute one surface in cooperation with one lateral wall Rsw of the recess R. In other words, the one lateral wall DAMsw of the bottom end of the dam DAM may meet (e.g., may contact or may extend from) the one lateral wall Rsw of the recess R.

The first functional layer 222a, the second functional layer 222c, the opposite electrode 223, and the capping layer 230 may each extend from the display area DA to be arranged on the top surface of the dam DAM and the recess R. The first functional layer 222a and the second functional layer 222c may be referred to as a sub-layer 222'.

The sub-layer 222', the opposite electrode 223, and the capping layer 230 may not be provided on the other side of the recess R at (e.g., in or on) which the dam DAM is not arranged. The sub-layer 222', the opposite electrode 223, and the capping layer 230 may include a transmission hole TAH exposing the opening area OA and a portion of the first non-display area NDA1. The area of the transmission hole TAH may be greater than the area of the opening area OA. The end of the transmission area TAH may correspond to (e.g., may be provided at) the end of the recess R on which the dam DAM is not arranged.

When a lateral wall from among the lateral walls Rsw of the recess R that is closer to the display area DA is a first lateral wall, the first lateral wall may meet the lateral wall DAMsw of the dam, and when a lateral wall from among the lateral walls Rsw of the recess R that is closer to the opening area OA is a second lateral wall, the end of the transmission hole TAH may be arranged on (e.g., may be defined by) the second lateral wall.

In the case where the first and second functional layers 222a and 222c each including an organic material are entirely formed on the first non-display area NDA1 to extend to the opening area OA, moisture may penetrate toward the organic light-emitting diode at (e.g., in or on) the display area DA through the first and second functional layers 222a and 222c due to characteristics of the organic material.

Therefore, the present embodiment prevents or substantially prevents moisture from penetrating into the display area DA by forming the transmission hole TAH in the first and second functional layers 222a and 222c including the organic material based on the recess R.

As shown in FIG. 8, the first inorganic encapsulation layer 310 may entirely cover the display area DA and the first non-display area NDA1. In the first non-display area NDA1, the first inorganic encapsulation layer 310 may entirely and continuously cover the dam DAM and the inside of the recess R. A stack of the first and second functional layers 222a and 222c, the opposite electrode 223, and the capping layer 230 may be arranged on the bottom surface of the recess R, and the first inorganic encapsulation layer 310 may cover the stack.

The organic encapsulation layer 320 may be formed by coating a monomer, and then hardening the monomer. The flow of the monomer may be controlled by the dam DAM. For example, as shown in FIGS. 8 and 9, the end of the organic encapsulation layer 320 may be arranged on one side of the dam DAM.

Similar to the first inorganic encapsulation layer 310, the second inorganic encapsulation layer 330 may entirely and continuously cover the inner surface of the recess R. A portion of the second inorganic encapsulation layer 330 may directly contact the first inorganic encapsulation layer 310 at (e.g., in or on) the second sub-non-display area SNDA2. The second inorganic encapsulation layer 330 may directly contact the first inorganic encapsulation layer 310 inside the recess R. Further, the first and second inorganic encapsulation layers 310 and 330 may contact each other on the top surface of the dam DAM.

The first inorganic encapsulation layer 310 may directly contact the third gate insulating layer 206, which is an inorganic insulating layer thereunder, at (e.g., in or on) the second sub-non-display area SNDA2 between the recess R and the opening area OA. In other words, in the present embodiment, because an organic material layer is not arranged at (e.g., in or on) a region between the recess R and the opening area OA, penetration of moisture toward the organic light-emitting diode at (e.g., in or on) the display area DA may be prevented or substantially prevented.

FIGS. 10A to 10H are cross-sectional views sequentially showing a method of manufacturing the display panel 10, according to an embodiment.

Figure 10A:
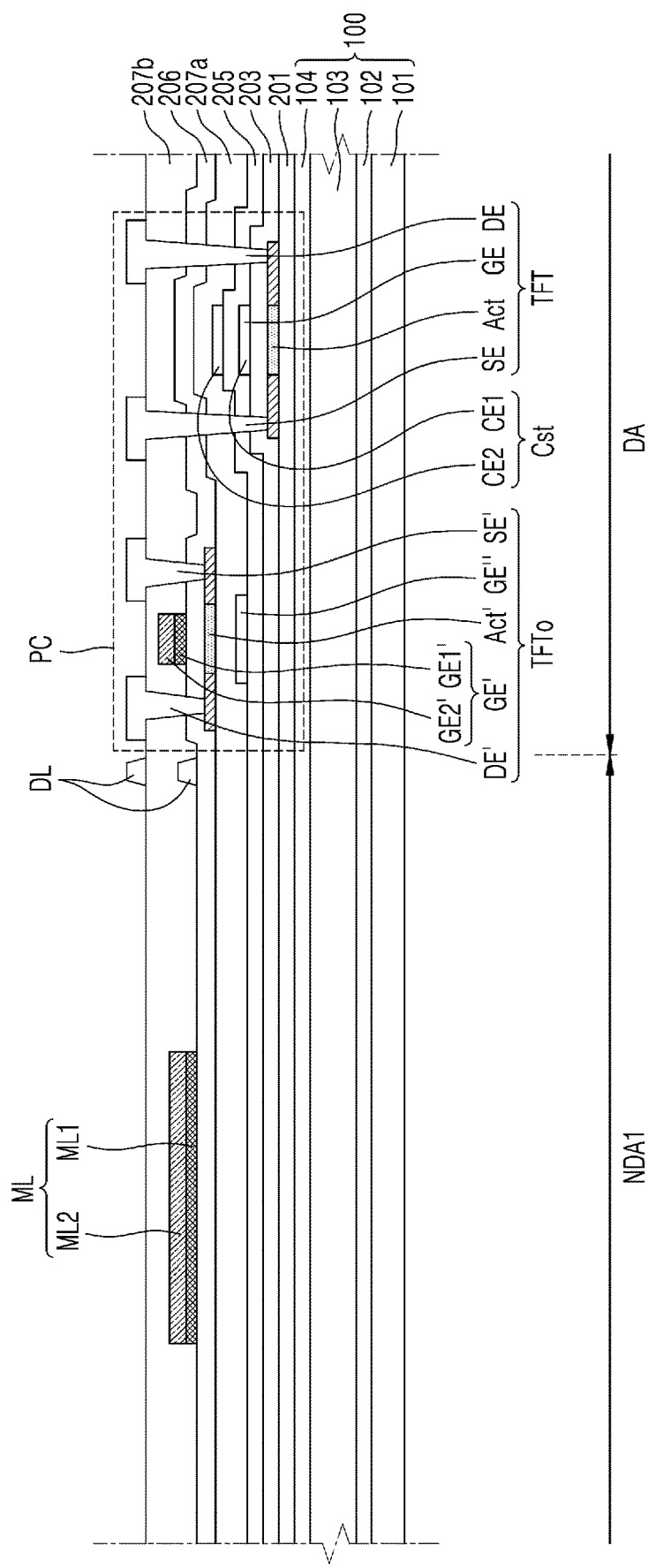
FIGS. 10A to 10H are cross-sectional views sequentially showing a method of manufacturing a display panel, according to an embodiment.

Referring to FIG. 10A, the pixel circuit PC is formed at (e.g., in or on) the display area DA, and a metal layer ML is formed at (e.g., in or on) the first non-display area NDA1. In an embodiment, the pixel circuit PC may include the first thin film transistor TFT and the second thin film transistor TFTo, the first thin film transistor TFT including polycrystalline silicon, and the second thin film transistor TFTo including an oxide semiconductor.

The metal layer ML may be concurrently (e.g., simultaneously) formed while the elements of the pixel circuit PC are formed. For example, the metal layer ML may include the same material as that of the second gate electrode GE', and be concurrently (e.g., simultaneously) formed with the second gate electrode GE'. The metal layer ML may include a conductive material including, for example, molybdenum (Mo), aluminum (Al), copper (Cu), and/or titanium (Ti).

In the present embodiment, the metal layer ML may include a sacrificial layer ML1 and a top layer ML2 that are stacked on one another, such that the top layer ML2 is on the sacrificial layer ML1. In this case, the sacrificial layer ML1 may include titanium (Ti), and the top layer ML2 may include molybdenum (Mo). In addition, the thickness of the sacrificial layer ML1 may be about 70 Å to about 300 Å, which may be suitable for a laser lift-off process.

Figure 10B:
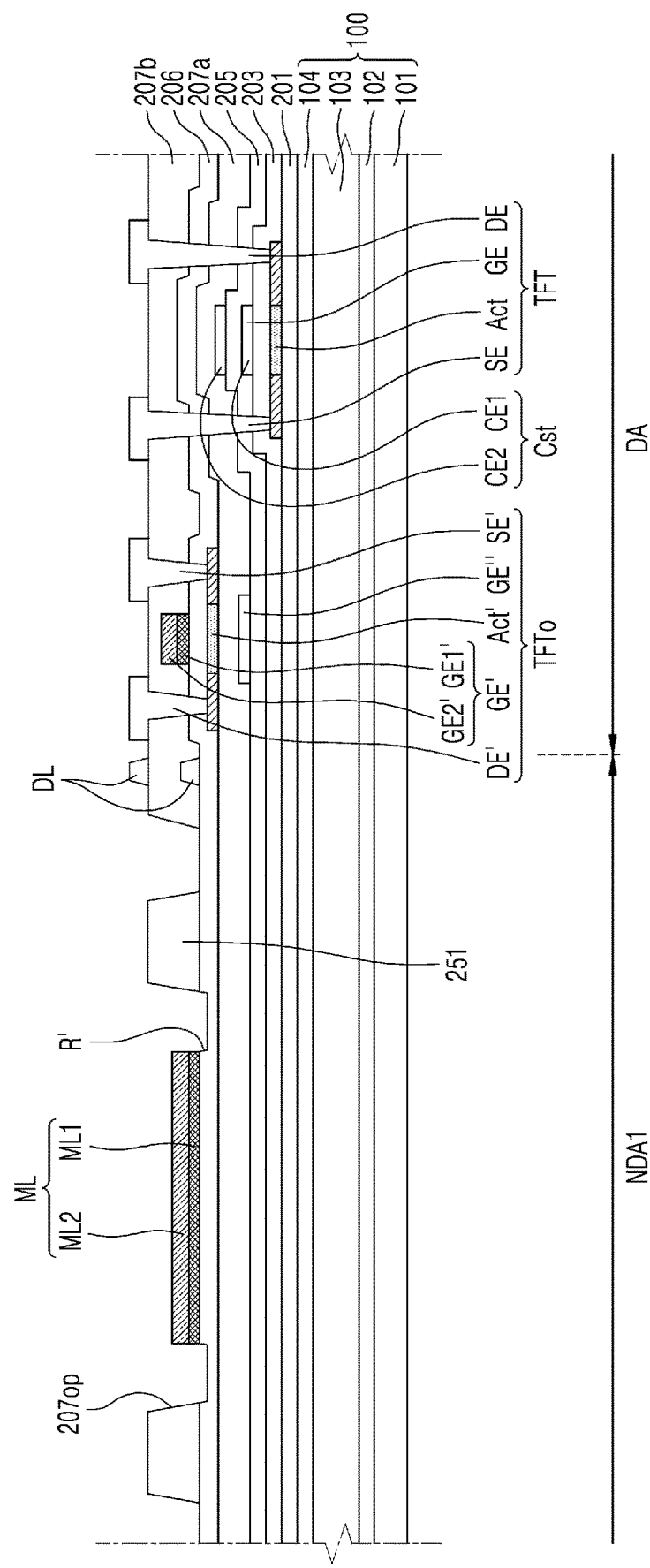

Referring to FIG. 10B, a first opening 207op may be formed by etching the second interlayer insulating layer 207b, which is an insulating layer covering the metal layer ML, to expose the metal layer ML. In this case, the first layer 251 of the dam DAM may be formed, and the recess R may be formed around (e.g., adjacent to ends of) the metal layer ML. The recess R may be formed by over-etching the first opening 207op when etching the first opening 207op. In other words, the recess R may be formed when a portion of the third gate insulating layer 206 is removed, the third gate insulating layer 206 being an insulating layer under the second interlayer insulating layer 207b. The recess R may include an element configured to facilitate disconnection of an organic material described in more detail below. Because the first layer 251 of the dam DAM and the recess R may be concurrently (e.g., simultaneously) formed, one lateral wall of the dam DAM and the inner wall of the recess R may constitute one surface.

Figure 10C:
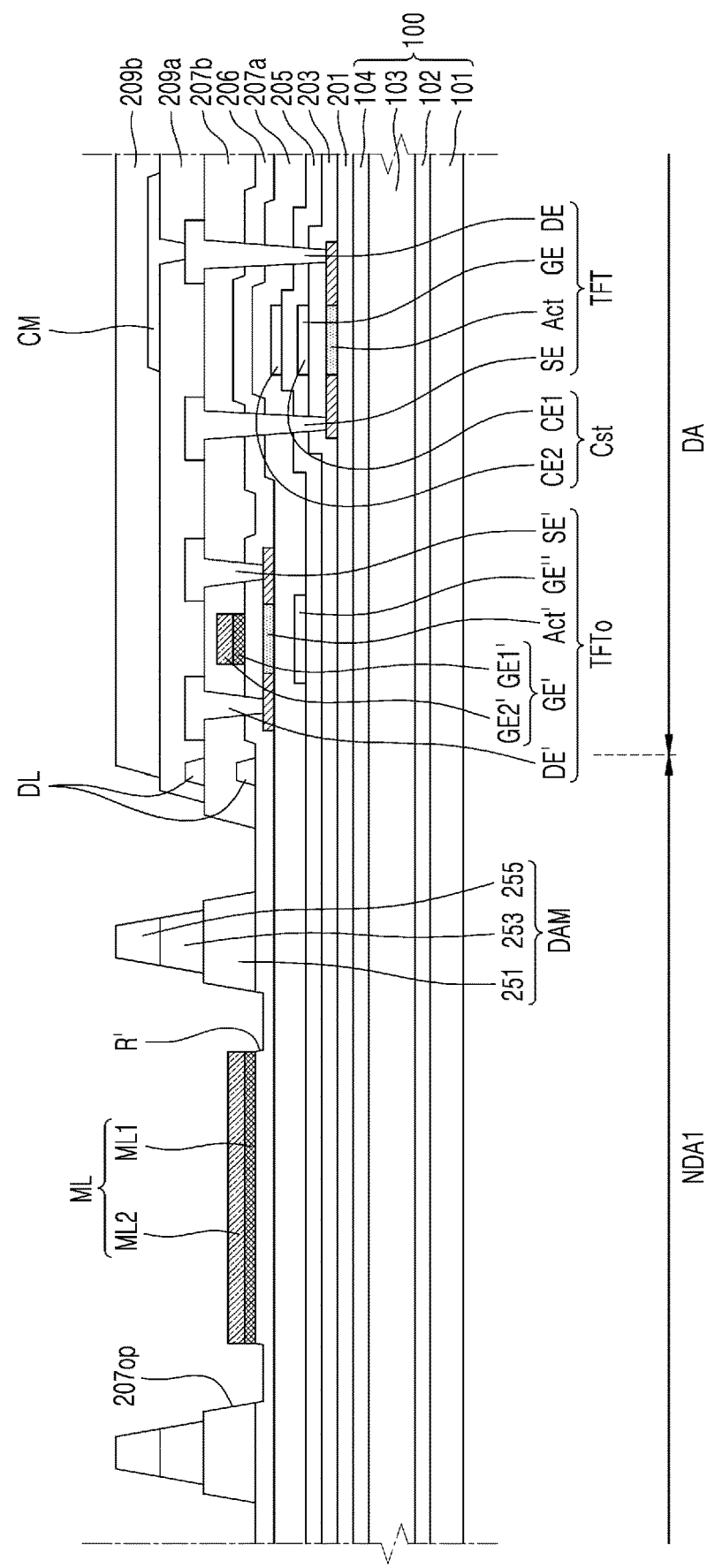

Referring to FIG. 10C, the second layer 253 of the dam DAM may be formed while the first planarization layer 209a is formed, and the third layer 255 of the dam DAM may be formed while the second planarization layer 209b is formed. The first planarization layer 209a and the second layer 253 of the dam DAM may be concurrently (e.g., simultaneously) formed by coating an organic material on an entire surface of the substrate 100, and light-hardening and patterning the organic material. Similarly, the second planarization layer 209b and the third layer 255 of the dam DAM may be concurrently (e.g., simultaneously) formed by coating an organic material on an entire surface of the substrate 100, and light-hardening and patterning the organic material.

Figure 10D:
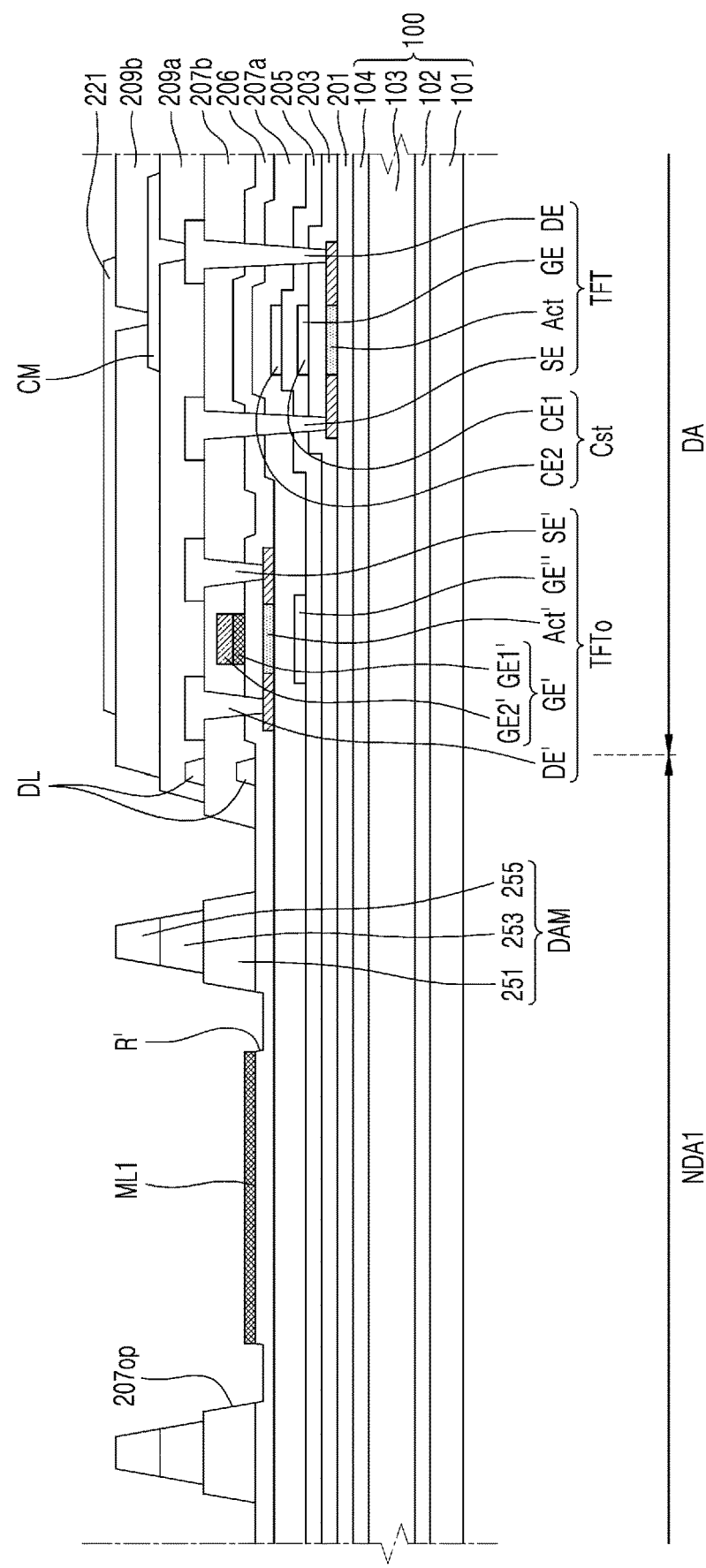

Referring to FIG. 10D, the sacrificial layer ML1 is exposed by removing the top layer ML2 of the metal layer ML. To reduce a mask process, the metal layer ML may be concurrently (e.g., simultaneously) formed with the second gate electrode GE' of the second thin film transistor TFTo.

It may be desirable that the second gate electrode GE' has a sufficient thickness range to lower a resistance value thereof. In this case, the metal layer ML having the same or substantially the same thickness as that of the second gate electrode GE' may be inappropriate to be used as a sacrificial layer for a laser lift-off process. Therefore, the laser lift-off process may be improved (e.g., may be optimized) by removing the top layer ML2 of the metal layer ML, and leaving only the sacrificial layer ML1 of the metal layer ML.

In this case, a process of removing the top layer ML2 may be performed during the same process as a process of forming the pixel electrode 221. In other words, when forming an electrode layer that constitutes the pixel electrode 221 on the entire surface of the substrate 100 and then patterning the electrode layer to form the pixel electrode 221, the top layer ML2 may be concurrently (e.g., simultaneously) etched.

Figure 10E:
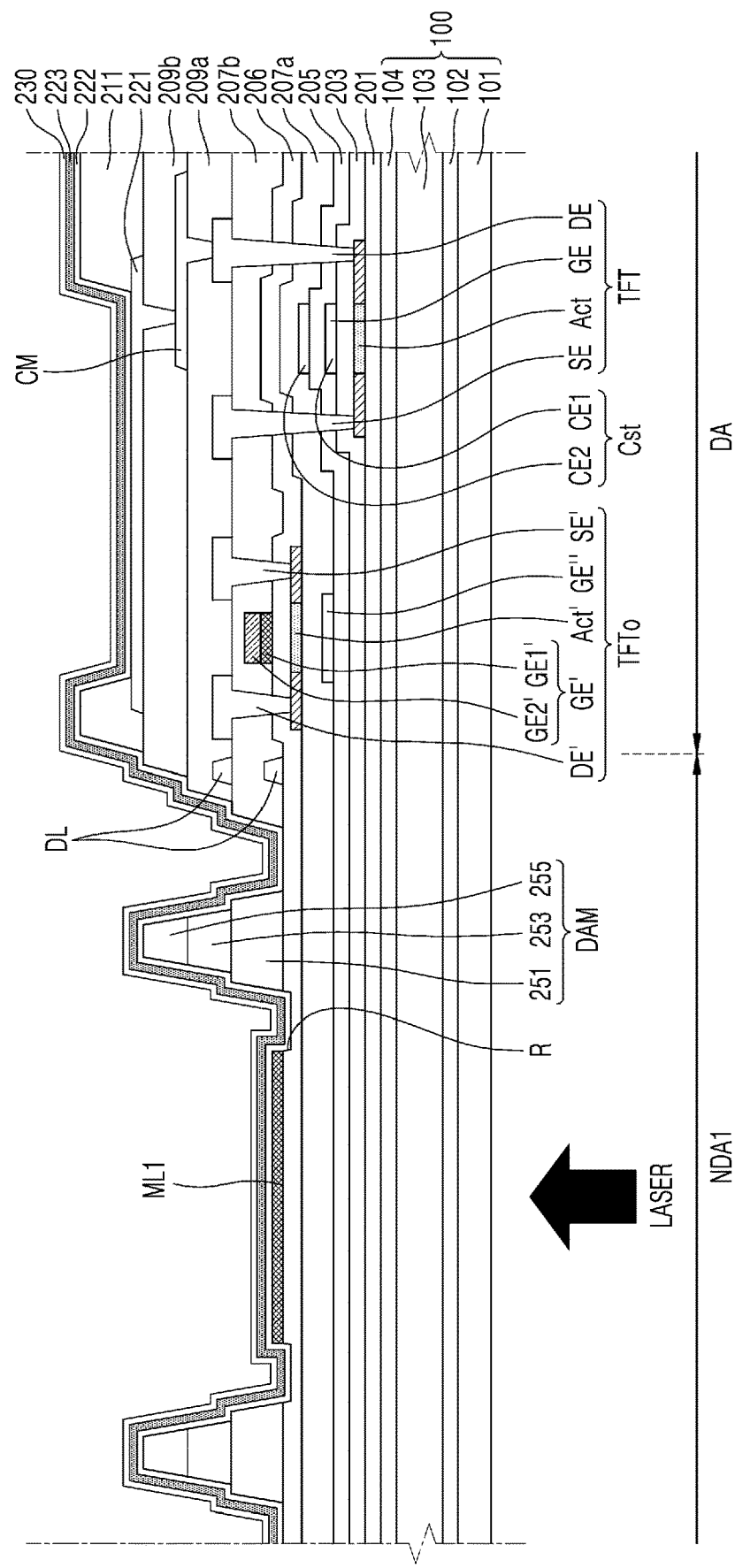

Referring to FIG. 10E, the intermediate layer 222, the opposite electrode 223, and the capping layer 230 are sequentially formed over the entire surface of the substrate 100. The emission layer 222b (e.g., see FIG. 7B) of the intermediate layer 222 may be formed to correspond to the pixel electrode 221. The first functional layer 222a and the second functional layer 222c of the intermediate layer 222, the opposite electrode 223, and the capping layer 230 may be sequentially stacked on the sacrificial layer ML1.

Laser light LASER may be irradiated from the bottom surface of the substrate 100 toward the sacrificial layer ML1. In other words, the laser light LASER may progress from the bottom surface of the substrate 100 in a thickness direction of the substrate 100, and may be irradiated to the bottom surface of the sacrificial layer ML1. In an embodiment, the laser light LASER may have an infrared wavelength. In the case where the laser light LASER includes an infrared ray, because a transmittance of the substrate 100 and the insulating layers 201 to 206 may be 80% to 90% or more, the laser light LASER may efficiently reach the sacrificial layer ML1.

Because the sacrificial layer ML1 includes an opaque metal, the sacrificial layer ML1 may absorb the laser light LASER. Therefore, thermal expansion of the sacrificial layer ML1 may occur, and the sacrificial layer ML1 to which the laser light LASER is irradiated may be lift-off from the insulating layers 201 to 206.

Figure 10F:
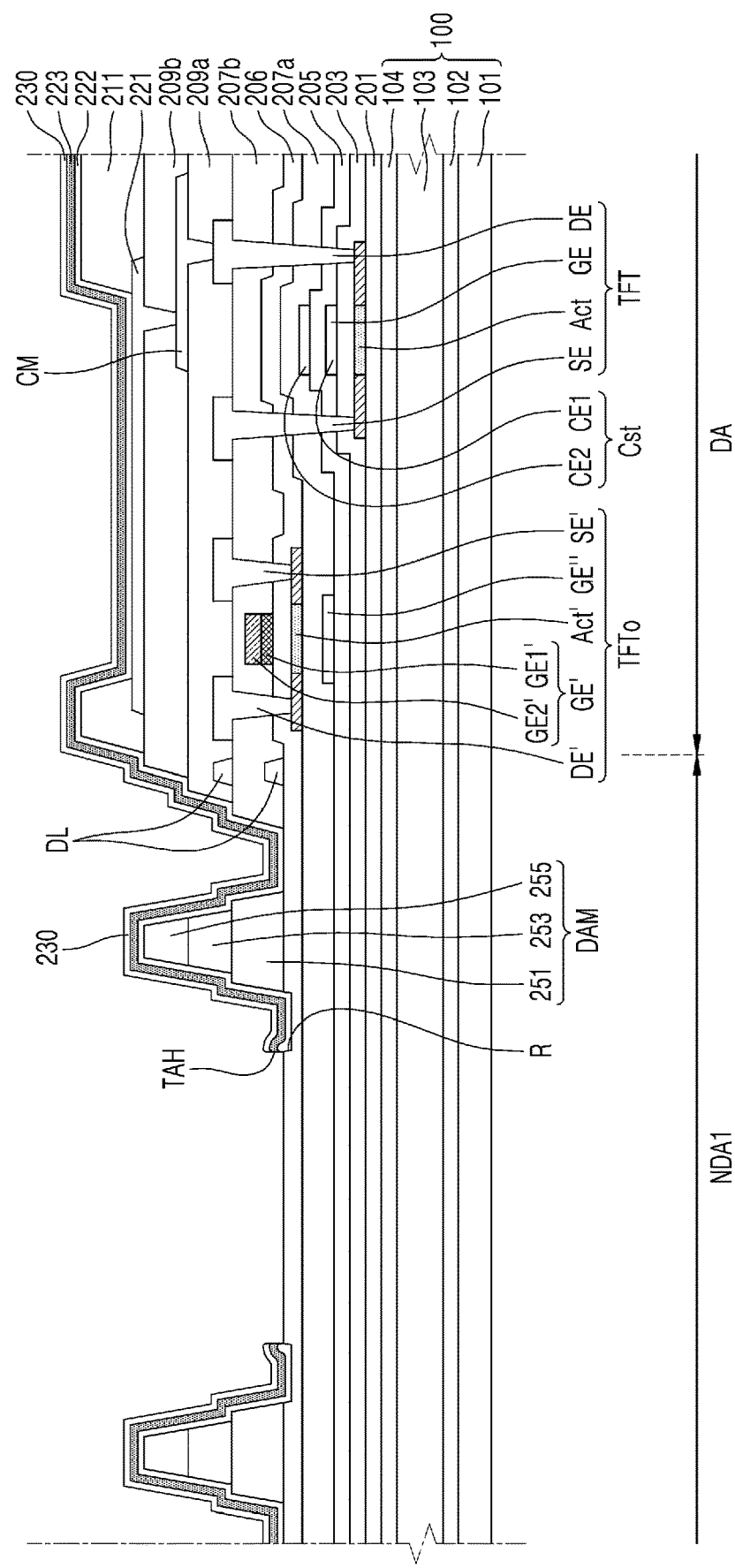

As a portion of the sacrificial layer ML1 is lift-off, the first functional layer 222a, the second functional layer 222c, the opposite electrode 223, and the capping layer 230 arranged on the sacrificial layer ML1 that is lift-off may be removed together. Therefore, as shown in FIG. 10F, the transmission hole TAH may be formed, such that the transmission hole TAH includes openings of the first functional layer 222a, the second functional layer 222c, the opposite electrode 223, and the capping layer 230. Because the recess R is formed around (e.g., adjacent to) the sacrificial layer ML1, disconnection of the first functional layer 222a, the second functional layer 222c, the opposite electrode 223, and the capping layer 230 may occur (e.g., may easily occur) due to a step difference between the recess R and the sacrificial layer ML1.

A melting point of a material of the sacrificial layer ML1 may be higher than a melting point of a material of the opposite electrode 223. For example, in an embodiment, the sacrificial layer ML1 may include titanium (Ti), and the opposite electrode 223 may include silver (Ag). In the case where the sacrificial layer ML1 includes silver (Ag), which may be the same material as that of the opposite electrode 223, the sacrificial layer ML1 may be lift-off before the opposite electrode 223 on the sacrificial layer ML1 is melted, and thus, may combine with Ag of the opposite electrode 223 to act as foreign substances.

In the present embodiment, because the sacrificial layer ML1 includes a material having a higher melting point than that of the opposite electrode 223, the opposite electrode 223 may be melted first, and then the sacrificial layer ML1 may be lift-off, and thus, foreign substances such as Ag particles may not occur or may be reduced.

However, the present disclosure is not limited thereto, and in some embodiments, it may be desired that the sacrificial layer ML1 includes the same material as that of the pixel electrode 221, for example, to simplify a process, and in this case, the sacrificial layer ML1 may include the same material as that of the pixel electrode 221. However, because the above described issue may occur in the case where the pixel electrode 221 includes Ag, the sacrificial layer ML1 according to the present embodiment may include the same material as that of the gate electrode (e.g., the second gate electrode GE') of the thin film transistor (e.g., the second thin film transistor TFTo) to prevent or substantially prevent the above described issue from occurring.

Figure 10G:
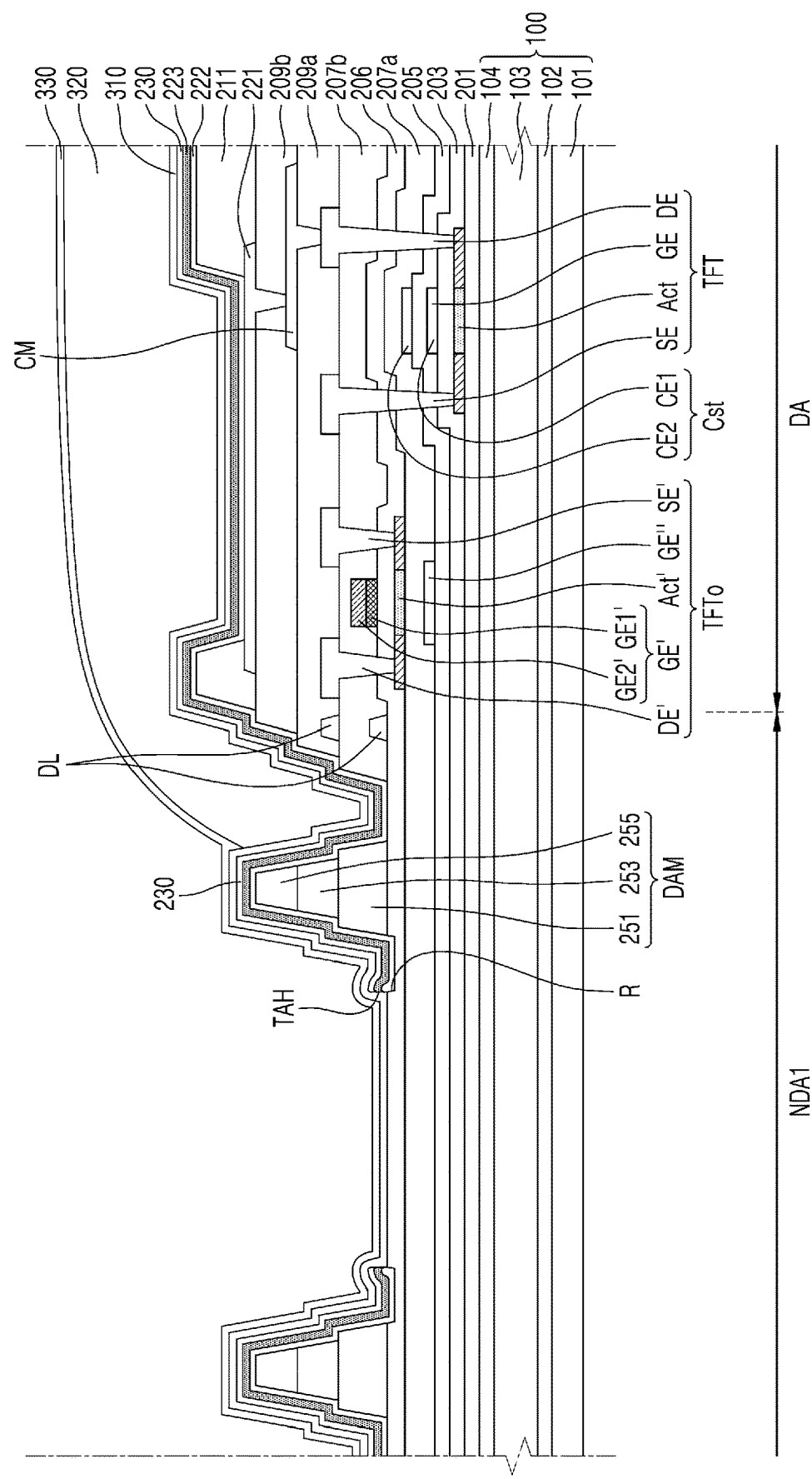

Referring to FIG. 10G, the thin-film encapsulation layer 300 may be formed. The first inorganic encapsulation layer 310 and the second inorganic encapsulation layer 330 may be formed on the entire surface of the substrate 100. The organic encapsulation layer 320 may be arranged to be outside the dam DAM.

The first inorganic encapsulation layer 310 may directly contact the third gate insulating layer 206 inside the transmission hole TAH, the third gate insulating layer 206 being an inorganic insulating layer. The second inorganic encapsulation layer 330 may directly contact the first inorganic encapsulation layer 310 inside the transmission hole TAH.

Figure 10H:
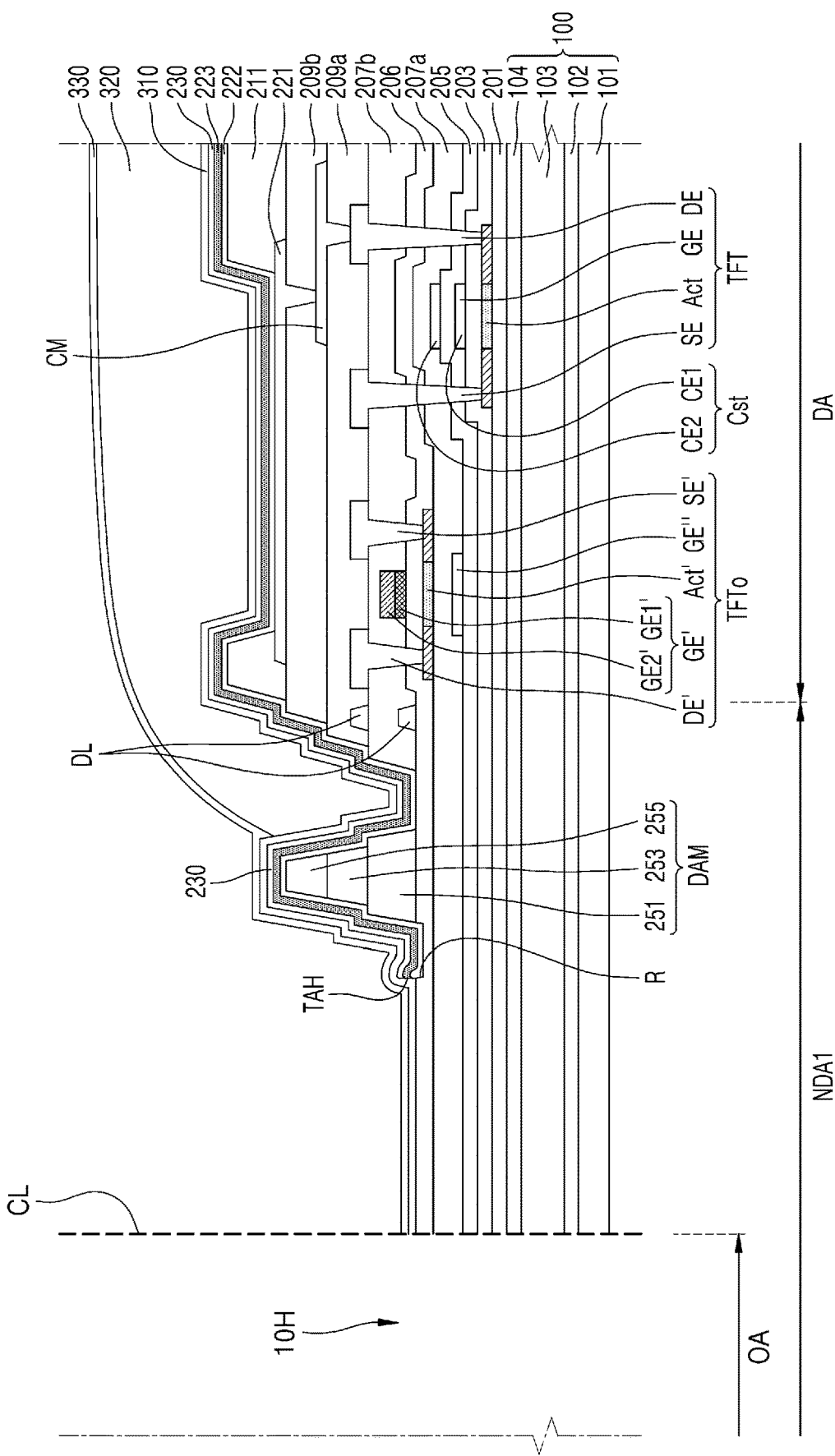

Referring to FIG. 10H, the first opening 10H may be formed by removing (e.g., portions of) the substrate 100 and the insulating layers above the substrate 100 along a cutting line CL. In the present embodiment, because the first functional layer 222a, the second functional layer 222c, and the capping layer 230 may each include an organic material and are not exposed through the lateral wall of the first opening 10H, the penetration of moisture through the first opening 10H may be prevented or substantially prevented.

In the display panel according to one or more example embodiments, the organic material layers around (e.g., surrounding) the opening may be removed by a laser lift process, and damage to the display elements by foreign substances, for example, such as external moisture may be prevented or substantially prevented. However, aspects and features of the present disclosure are not limited thereto.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display panel comprising:
   a substrate comprising an opening area, a display area, and a non-display area, the display area surrounding the opening area, and the non-display area being between the opening area and the display area;
   a plurality of display elements at the display area of the substrate, each of the plurality of display elements comprising a pixel electrode, an emission layer on the pixel electrode, and an opposite electrode on the emission layer;
   a thin-film encapsulation layer covering the plurality of display elements, and comprising a first inorganic encapsulation layer, an organic encapsulation layer, and a second inorganic encapsulation layer;
   a dam at the non-display area, and protruding from a top surface of a first insulating layer; and
   a recess between the opening area and the dam, and recessed in a depth direction of the first insulating layer,
   wherein a lateral wall of the dam meets a first lateral wall of the recess that is closest to the display area from among lateral walls of the recess.

2. The display panel of claim 1, further comprising:
   at least one of a first functional layer between the pixel electrode and the emission layer, or a second functional layer between the emission layer and the opposite electrode,
   wherein the opposite electrode and the at least one of the first functional layer or the second functional layer extend from the display area to the non-display area to be located inside the recess, and include a transmission hole exposing a portion of the non-display area.

3. The display panel of claim 2, wherein a lateral wall of the transmission hole meets a second lateral wall from among the lateral walls of the recess, the second lateral wall being adjacent to the opening area.

4. The display panel of claim 2, further comprising a capping layer on the opposite electrode,
   wherein the capping layer is on a top portion of the dam, and inside the recess.

5. The display panel of claim 1, further comprising a pixel circuit comprising at least one thin film transistor at the display area of the substrate, and electrically connected to the pixel electrode.

6. The display panel of claim 5, wherein the at least one thin film transistor comprises a first thin film transistor comprising polycrystalline silicon, and a second thin film transistor comprising an oxide semiconductor.

7. The display panel of claim 6, wherein a second gate electrode of the second thin film transistor comprises a first layer and a second layer that are stacked on one another, the first layer comprising titanium (Ti), and the second layer comprising molybdenum (Mo).

8. The display panel of claim 5, wherein a gate electrode of the at least one thin film transistor comprises a first layer, and a second layer stacked on the first layer.

9. The display panel of claim 8, wherein the first layer comprises titanium (Ti), and the second layer comprises molybdenum (Mo).

10. The display panel of claim 9, wherein a thickness of the first layer is in a range from about 70 Å to about 300 Å.

11. A display apparatus comprising:
    a display panel comprising:
      a substrate comprising an opening area, a display area, and a non-display area, the opening area corresponding to a first opening of the display panel, the display area surrounding the opening area, and the non-display area being between the opening area and the display area;
      a plurality of display elements at the display area of the substrate, each of the plurality of display elements comprising a pixel electrode, an emission layer on the pixel electrode, and an opposite electrode on the emission layer;

a thin-film encapsulation layer covering the plurality of display elements, and comprising a first inorganic encapsulation layer, an organic encapsulation layer, and a second inorganic encapsulation layer;
a dam at the non-display area, and protruding from a top surface of a first insulating layer; and
a recess between the opening area and the dam, and recessed in a depth direction of the first insulating layer; and
a component located to correspond to the first opening, wherein a lateral wall of the dam meets a first lateral wall of the recess that is closest to the display area from among lateral walls of the recess.

12. The display apparatus of claim 11, further comprising:
an input sensing member over the display panel; and
an optical functional member on the input sensing member,
wherein at least one of the input sensing member or the optical functional member includes an opening corresponding to the first opening.

13. The display apparatus of claim 11, wherein the component is located inside the first opening.

14. The display apparatus of claim 11, wherein the component comprises a camera.

15. The display apparatus of claim 11, further comprising:
at least one of a first functional layer between the pixel electrode and the emission layer, or a second functional layer between the emission layer and the opposite electrode,
wherein the opposite electrode and the at least one of the first functional layer or the second functional layer extend from the display area to the non-display area to be located inside the recess, and include a transmission hole exposing a portion of the non-display area.

16. The display apparatus of claim 15, further comprising a capping layer on the opposite electrode,
wherein the capping layer is continuously located over the dam and the recess.

17. The display apparatus of claim 11, further comprising a pixel circuit comprising at least one thin film transistor at the display area of the substrate, and electrically connected to the pixel electrode.

18. The display apparatus of claim 17, wherein a gate electrode of the at least one thin film transistor comprises a first layer and a second layer, the first layer comprising titanium (Ti), and the second layer comprising molybdenum (Mo).

19. The display apparatus of claim 18, wherein a thickness of the first layer is in a range from about 70 Å to about 300 Å.

20. The display apparatus of claim 17, wherein the at least one thin film transistor comprises a first thin film transistor comprising polycrystalline silicon, and a second thin film transistor comprising an oxide semiconductor.

* * * * *